US008466511B2

(12) United States Patent
Oh et al.

(10) Patent No.: US 8,466,511 B2
(45) Date of Patent: Jun. 18, 2013

(54) VERTICAL CHANNEL FIN FIELD-EFFECT TRANSISTORS HAVING INCREASED SOURCE/DRAIN CONTACT AREA AND METHODS FOR FABRICATING THE SAME

(75) Inventors: Chang-Woo Oh, Gyeonggi-do (KR); Dong-Gun Park, Gyeonggi-do (KR); Sung-Young Lee, Gyeonggi-do (KR); Jeong-Dong Choe, Gyeonggi-do (KR); Dong-Won Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 895 days.

(21) Appl. No.: 12/613,025

(22) Filed: Nov. 5, 2009

(65) Prior Publication Data
US 2010/0044784 A1 Feb. 25, 2010

Related U.S. Application Data

(62) Division of application No. 11/065,002, filed on Feb. 24, 2005, now abandoned.

(30) Foreign Application Priority Data

Feb. 24, 2004 (KR) .................................. 2004-12371

(51) Int. Cl.
*H01L 29/78* (2006.01)
(52) U.S. Cl.
USPC ................. 257/329; 257/E29.262; 257/510
(58) Field of Classification Search
USPC ............... 257/330, 331, 332, 510, 511, 512, 257/513, 514, 515, 622, E29.262
See application file for complete search history.

(56) References Cited

U.S. PATENT DOCUMENTS

| 5,391,506 | A | 2/1995 | Tada et al. | |
|---|---|---|---|---|
| 5,844,278 | A * | 12/1998 | Mizuno et al. | 257/345 |
| 6,396,108 | B1 | 5/2002 | Krivkapic et al. | |
| 6,413,802 | B1 | 7/2002 | Hu et al. | |
| 6,495,403 | B1 | 12/2002 | Skotnicki et al. | |
| 6,525,403 | B2 * | 2/2003 | Inaba et al. | 257/618 |
| 6,764,884 | B1 | 7/2004 | Yu et al. | |
| 7,148,526 | B1 | 12/2006 | An et al. | |
| 7,902,581 | B2 * | 3/2011 | Frohberg et al. | 257/296 |
| 8,169,027 | B2 * | 5/2012 | Doyle et al. | 257/353 |
| 2002/0011612 | A1 | 1/2002 | Hieda | |
| 2003/0178677 | A1 | 9/2003 | Clark et al. | |
| 2004/0007738 | A1 | 1/2004 | Fried et al. | |
| 2004/0135212 | A1 | 7/2004 | Dokumaci et al. | |

(Continued)

FOREIGN PATENT DOCUMENTS

| JP | 2002-151688 | 5/2002 |
|---|---|---|
| JP | 2002-270850 | 9/2002 |
| KR | 10-2002-0078996 | 10/2002 |

*Primary Examiner* — Roy Potter
(74) *Attorney, Agent, or Firm* — Myers Bigel Sibley & Sajovec, P.A.

(57) ABSTRACT

A fin field-effect transistor (FinFET) device includes a fin-shaped active region having first and second source/drain regions therein and a channel region therebetween vertically protruding from a semiconductor substrate. A gate electrode is formed on an upper surface and sidewalls of the channel region. First and second source/drain contacts are formed on respective upper surfaces and sidewalls of the first and second source/drain regions of the fin-shaped active region at opposite sides of the gate electrode. The channel region may be narrower than the first and second source/drain regions of the fin-shaped active region.

20 Claims, 47 Drawing Sheets

U.S. PATENT DOCUMENTS

| | | |
|---|---|---|
| 2004/0152270 A1 | 8/2004 | Weis |
| 2004/0197975 A1 | 10/2004 | Krivokapic et al. |
| 2005/0035391 A1 | 2/2005 | Lee et al. |
| 2005/0035415 A1 | 2/2005 | Yeo et al. |
| 2005/0104091 A1 | 5/2005 | Tabery et al. |
| 2005/0124101 A1 | 6/2005 | Beintner |
| 2005/0145938 A1 | 7/2005 | Lin |
| 2005/0156171 A1 | 7/2005 | Brask et al. |
| 2005/0202608 A1 | 9/2005 | Beintner |
| 2006/0172497 A1 | 8/2006 | Hareland et al. |

* cited by examiner

VERTICAL CHANNEL FIN FIELD-EFFECT TRANSISTORS HAVING INCREASED SOURCE/DRAIN CONTACT AREA AND METHODS FOR FABRICATING THE SAME

CLAIM OF PRIORITY

The present application is a divisional of and claims priority from U.S. patent application Ser. No. 11/065,002, filed Feb. 24, 2005 now abandoned, which claims the benefit of Korean Patent Application No. 10-2004-0012371 filed on Feb. 24, 2004, the disclosures of which are hereby incorporated by reference herein in their entireties.

FIELD OF THE INVENTION

The present invention relates to semiconductor devices, and more particularly, to field-effect transistors and methods for fabricating the same.

BACKGROUND OF THE INVENTION

As semiconductor devices are scaled-down, a variety of operational and structural problems may result. For example, in field-effect transistors (FETs) having a planar channel region, problems may occur when the length of the channel region is reduced to 100 nm and below. More particularly, planar channel FETs may include gate electrodes that are formed on a planar channel region. Since an electric field at upper and lower portions of the channel may be asymmetrical, the capacity of the gate to control the channel may become deteriorated as channel length is decreased. In order to improve the control capacity of the gate with respect to the channel, double-gate field effect transistors and/or triple-gate field effect transistors have been developed. In double- and triple-gate field effect transistors, the gate electrode may be formed to be in contact with multiple sides of the channel. As such, a more symmetrical electric field may be applied to the channel, which may thereby improve the control capacity of the gate with respect to the channel. As a result, it may be possible to better suppress short channel effects.

Double-gate fin field-effect transistors (FinFETs) are disclosed in U.S. Pat. No. 6,396,108 entitled "SELF-ALIGNED DOUBLE GATE SILICON-ON-INSULATOR (SOI) DEVICE". FinFET devices may include a fin-shaped active region vertically protruding from a semiconductor substrate. Since the height of the fin may be greater than the thickness thereof, a conductive layer may be formed on the fin so as to form a gate electrode on an upper portion and sidewalls of the fin. However, in some instances, the shape of the fin may be altered due to over-etching of the fin when the gate electrode is formed.

Furthermore. FinFET devices may be capable of driving relatively high current through the channel at two and/or three sides of the fin. Therefore, in order to improve the control capacity of the gate with respect to the channel, the width/thickness of the fin may reduced, and wider source/drain regions may be formed in order to output the high current.

SUMMARY OF THE INVENTION

According to some embodiments of the present invention, a FinFET device may include a fin-shaped active region having first and second source/drain regions therein and a channel region therebetween vertically protruding from a semiconductor substrate. A gate electrode may be formed on an upper surface and sidewalls of the channel region. First and second source/drain contacts may be formed on respective upper surfaces and sidewalls of the first and second source/drain regions of the fin-shaped active region at opposite sides of the gate electrode.

In some embodiments, the channel region may be narrower than the first and second source/drain regions of the fin-shaped active region.

In other embodiments, the device may further include a gate insulation layer on the upper surface and sidewalls of the channel region between the gate electrode and the channel region to form a triple-gate FinFET device.

In still other embodiments, the device may further include a capping insulation layer on the upper surface of the channel region between the gate electrode and the channel region to form a double-gate FinFET device. The channel region may be narrower than the capping insulation layer.

In some embodiments, the device may include sidewall spacers on the first and second source/drain regions adjacent opposing sidewalls of the gate electrode. The gate electrode may include a lower gate electrode on the upper surface and sidewalls of the channel region and an upper gate electrode on the lower gate electrode. The sidewall spacers may include an upper sidewall spacer adjacent sidewalls of the upper gate electrode and a lower sidewall spacer adjacent sidewalls of the lower gate electrode.

In other embodiments, the substrate may be a silicon-on-insulator substrate having a base layer, a buried insulation layer on the base layer, and a semiconductor layer on the buried insulation layer. The fin-shaped active region may vertically protrudes from the semiconductor layer.

According to other embodiments of the present invention, a Fin FET device may include a semiconductor substrate, a fin-shaped active region vertically extending from the semiconductor substrate, and a device isolation layer adjacent sidewalls of the fin-shaped active region. The device may further include a gate electrode on an upper surface and sidewalls of the fin-shaped active region, sidewall spacers on sidewalls of the gate electrode, and source/drain regions in the fin-shaped active region at opposite sides of the gate electrode. Upper surfaces and sidewalls of the fin-shaped active region may be exposed at the source/drain regions.

According to further embodiments of the present invention a method of forming a fin field-effect transistor may include forming a fin-shaped active region having first and second source/drain regions therein and a channel region therebetween vertically protruding from a semiconductor substrate. Agate electrode may be formed on an upper surface and sidewalls of the channel region. First and second source/drain contacts may be formed at opposite sides of the gate electrode on respective upper surfaces and sidewalls of the first and second source/drain regions of the fin-shaped active region.

In some embodiments, the method may further include recessing the sidewalls of the channel region prior to forming the gate electrode such that the channel region is narrower than the first and second source/drain regions of the fin-shaped active region. In some embodiments, recessing the sidewalls of the channel region may include isotropically etching the sidewalls of the channel region to narrow the channel region. In other embodiments, recessing the sidewalls of the channel region may include thermally oxidizing the channel region to form an oxide layer on the upper surface and sidewalls of the channel region and removing the oxide layer to narrow the channel region.

According to some embodiments of the present invention, a method of forming a FinFET may include forming a fin-shaped active region vertically protruding from a semiconductor substrate, and forming a device isolation layer on the fin-shaped active region. The device isolation layer may include a trench therein exposing a first portion of the fin-shaped active region including an upper surface and sidewalls thereof. A gate electrode may be formed in the trench on the upper surface and sidewalls of the first portion of the fin-shaped active region, and first and second source/drain regions may be formed in second portions of the fin-shaped active region at opposite sides of the gate electrode. The device isolation layer may be recessed at opposite sides of the gate electrode to expose upper surfaces and sidewalls of the second portions of the fin-shaped active region.

In some embodiments, the method may further include forming first and second source/drain contacts on the respective first and second source/drain regions at the exposed upper surface and sidewalls of the second portions of the fin-shaped active region.

In other embodiments, forming the first and second source/drain regions may include implanting dopants into the upper surfaces and sidewalls of the second portions of the fin-shaped active region after recessing the device isolation layer.

In further embodiments, the method may further include implanting dopants into the first portion of the fin-shaped active region prior to forming the gate electrode to form a channel region therein.

In some embodiments, the method may include recessing the sidewalls of the first portion of the fin-shaped active region before forming the gate electrode such that the first portion is narrower than the second portions of the fin-shaped active region.

In other embodiments, forming the device isolation layer may include forming an insulation layer on the substrate including the fin-shaped active region and recessing the insulation layer by chemical-mechanical polishing to expose the upper surface of the fin-shaped active region. A mask pattern may be formed on the insulation layer and the upper surface of the fin-shaped active region. The mask pattern may include an opening therein exposing the upper surface of the first portion of the fin-shaped active region and a portion of the insulation layer. The exposed portion of the insulation layer may be etched to define a trench in the insulation layer and to expose the sidewalls of the first portion of the fin-shaped active region.

In some embodiments, the method may further include forming a gate insulation layer on the upper surface and sidewalls of the first portion of the fin-shaped active region. Forming the gate electrode may include forming the gate electrode on the gate insulation layer to define a triple-gate FinFET device.

In other embodiments, the method may further include forming a capping insulation layer on the upper surface of the first portion of the fin-shaped active region. Forming the gate electrode may include forming the gate electrode on the capping insulation layer on the upper surface and on the gate insulation layer on the sidewalls of the first portion of the fin-shaped active region to define a double-gate FinFET device.

In further embodiments, the method may include forming sidewall spacers on the first and second source/drain regions adjacent opposing sidewalls of the gate electrode. Forming the gate electrode may include forming a lower gate electrode on the upper surface and sidewalls of the first portion of the fin-shaped active region and forming an upper gate electrode on the lower gate electrode. Forming the sidewall spacers may include forming upper sidewall spacers adjacent sidewalls of the upper gate electrode and forming lower sidewall spacers adjacent sidewalls of the lower gate electrode.

BRIEF DESCRIPTION OF THE DRAWINGS

FIGS. 2A to 8A are plan views illustrating exemplary operations for fabricating FinFETs according to some embodiments of the present invention.

FIGS. 2B to 8B are cross-sectional views taken along line I-I' of FIGS. 2A to 8A, respectively.

FIGS. 2C to 8C are cross-sectional views taken along line II-II' of FIGS. 2A to 8A, respectively.

FIGS. 11A to 16A are plan views illustrating exemplary operations for fabricating FinFETs according to further embodiments of the present invention.

FIGS. 11B to 16B are cross-sectional views taken along line III-III' of FIGS. 11A to 16A, respectively.

FIGS. 11C to 16C are cross-sectional views taken along line IV-IV of FIGS. 11A to 16A.

FIGS. 20A to 25A are plan views illustrating exemplary operations for forming FinFETs according to still further embodiment of the present invention.

FIGS. 20B to 25B are cross-sectional views taken along line V-V of FIGS. 20A to 25A, respectively.

FIGS. 20C to 25C are cross-sectional views taken along line VI-VI' of FIGS. 20A to 25A, respectively.

FIGS. 28A to 32A are plan views illustrating exemplary operations for fabricating FinFETs according to other embodiments of the present invention.

FIGS. 28B to 32B are cross-sectional views taken along line VII-VII' of FIGS. 28A to 32A, respectively.

FIGS. 28C to 32C are cross-sectional views taken along line VIII-VIII' of FIGS. 28A to 32A, respectively.

FIGS. 36A to 39A are plan views illustrating exemplary operations for fabricating FinFETs according to still other embodiments of the present invention.

FIGS. 36B to 39B are cross-sectional views taken along line XI-XI' of FIGS. 36A to 39A, respectively.

FIGS. 36C to 39C are cross-sectional views taken along line XI-XI' of FIGS. 36A to 39A, respectively.

FIGS. 42A to 45A are plan views illustrating exemplar) operations for fabricating FinFETs according to yet still other embodiments of the present invention.

FIGS. 42B to 45B are cross-sectional views taken along line XI-XI' of FIGS. 42A to 45A, respectively.

FIGS. 42C to 45C are cross-sectional views taken along line XII-XII' of FIGS. 42A to 45A, respectively.

DETAILED DESCRIPTION OF EMBODIMENTS OF THE INVENTION

Figure 1A:
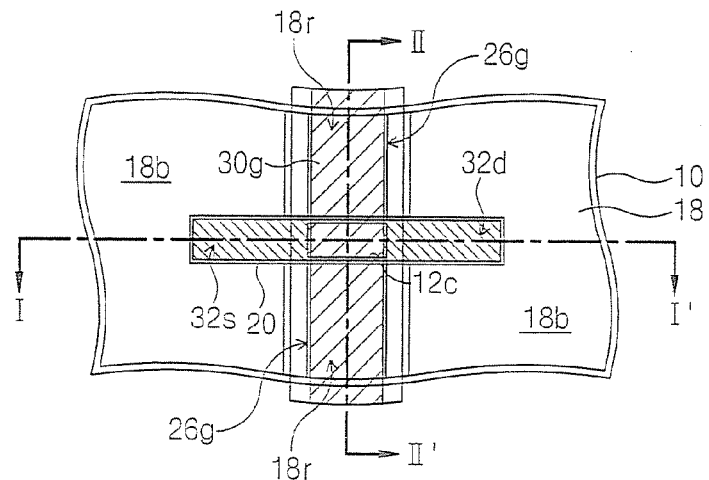
FIG. 1A is a plan view illustrating fin field-effect transistors (FinFETs) according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top." may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 1B:
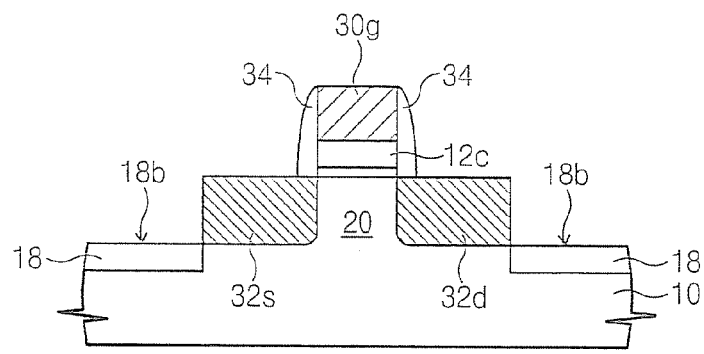
FIG. 1B is a cross-sectional view taken along line I-I' of FIG. 1A.
Figure 1C:
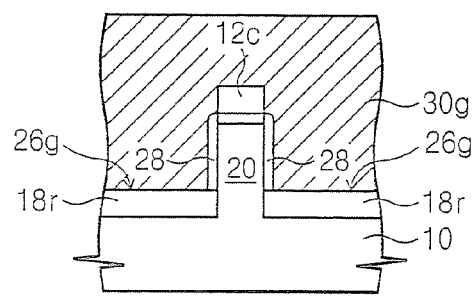
FIG. 1C is a cross-sectional view taken along line II-II' of FIG. 1A.

FIG. 1A is a plan view illustrating a fin field-effect transistor (FinFET) according to some embodiments of the present invention. FIG. 1B is a cross-sectional view-taken along line I-I' of FIG. 1A. FIG. 1C is a cross-sectional view taken along line II-II' of FIG. 1A.

Referring now to FIGS. 1A, 1B and 1C, a fin-shaped active region 20 is formed vertically protruding from a semiconductor substrate 10. A device isolation layer 18 including a gate groove 26g covers sidewalls of the fin 20. The bottom of the gate groove 26g is formed by a recessed device isolation layer 18r. A gate electrode 30g fills the gate groove 26g and covers an upper portion and both sidewalls of the fin 20. A capping layer 12c is positioned between the gate electrode 30g and the upper portion of the fin 20. A gate insulation layer 28 is positioned between the gate electrode 30g and each sidewall of the fin 20 to form a double-gate structure. A sidewall spacer 34 is formed at both sidewalls of the gate electrode 30g. Source/drain regions 32s and 32d are formed in the fin 20 at opposite sides of the gate electrode 30g. The device isolation layer 18 is aligned with the sidewall spacer 34 and recessed to form a recessed portion 18b. As such, the sidewalls of the fin 20 is partially exposed, and the surface of the source/drain regions 32s and 32d are exposed at the exposed sidewalls. Accordingly, the exposed surface of the source/drain regions 32s and 32d may be greater than the thickness of the fin 20 in a direction parallel to the gate electrode 30g. In other words, the surface area of the exposed upper surface and sidewalls of the source/drain regions 32s and 32d may be greater than the surface area provided by the upper surface alone, which is limited by the width of the fin 20. Although not shown, source/drain contacts may be respectively formed on the source/drain regions 32s and 32d. The source/drain contacts may be in contact with the upper portion and the exposed sidewalls of the fin 20 where the source/drain regions 32s and 32d are formed. In other words, even as fin width/thickness is scaled-down, the exposed source/drain regions 32s and 32d provide a greater contact area for the source/drain contacts, i.e. at both sidewalls of the fin 20 as well as at the upper surface. Accordingly, contact resistance may be reduced due to the greater contact surface area. Resistance may be further reduced by forming a silicide layer on the exposed surface of the source/drain regions 32s and 32d and the gate electrode 30g.

FIGS. 2A to 8A are plan views illustrating exemplary operations for fabricating FinFETs according to some embodiments of the present invention. FIGS. 2B to 8B are cross-sectional views taken along line I-I' of FIGS. 2A to 8A. FIGS. 2C to 8C are cross-sectional views taken along line II-II' of FIGS. 2A to 8A.

Figure 2A:
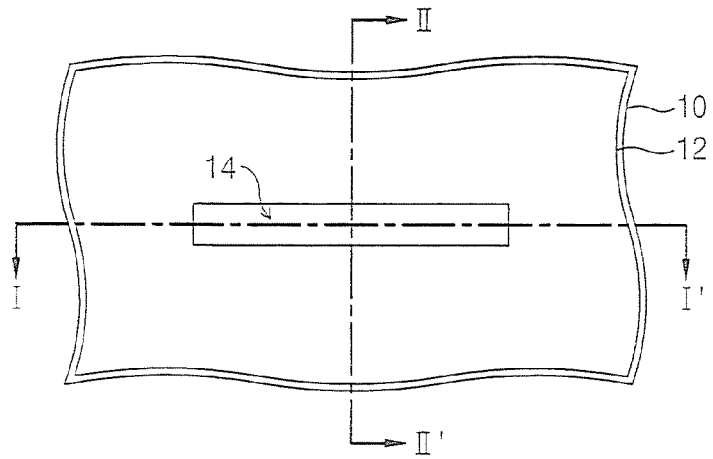
Figure 2B:
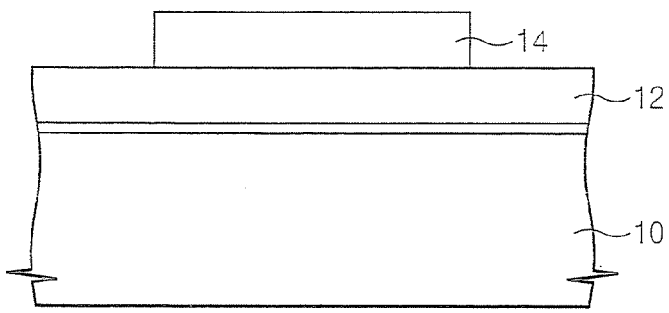
Figure 2C:
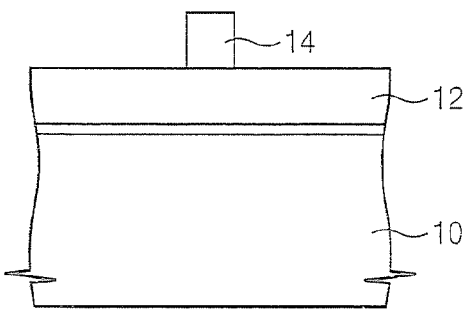
Figure 3A:
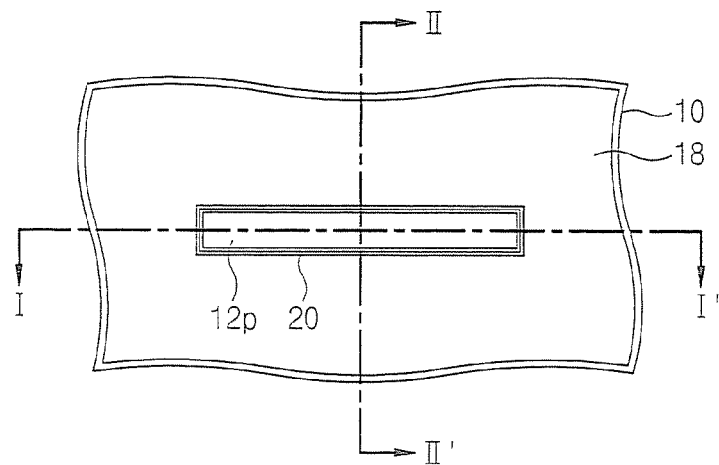
Figure 3B:
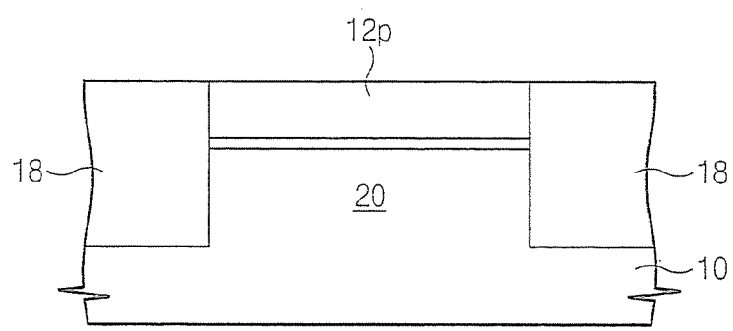
Figure 3C:
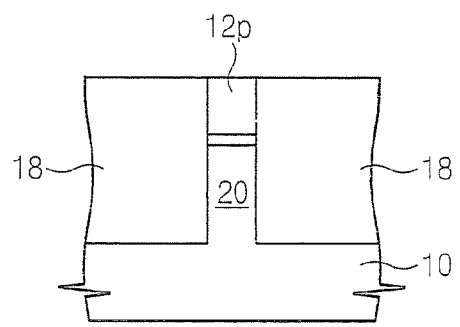

Referring now to FIGS. 2A, 2B and 2C, a hard mask layer 12 is formed on a semiconductor substrate 10. A photoresist pattern 14 for forming a fin is formed on the hard mask layer 12. Referring to FIGS. 3A, 3B and 3C, the hard mask layer 12 and the semiconductor substrate 10 are patterned using the photoresist pattern 14 as an etching mask to define a fin-shaped active region 20 vertically protruding from the substrate 10 and a device isolation region surrounding the fin 20. A hard mask pattern 12p is formed on the upper portion of the fin 20. The photoresist pattern 14 is removed, and the semiconductor substrate 10 is patterned using the hard mask pattern 12p as an etching mask. An insulation layer is then formed on an entire surface of the semiconductor substrate 10, filling the device isolation region 18. The insulation layer is polished, such as by chemical mechanical polishing (CMP), to expose the hard mask pattern 12p and form the device isolation layer 18 in the device isolation region.

Figure 4A:
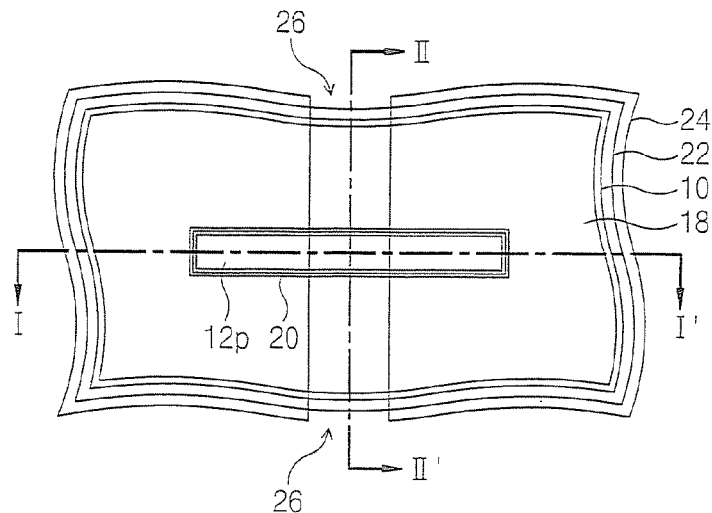
Figure 4B:
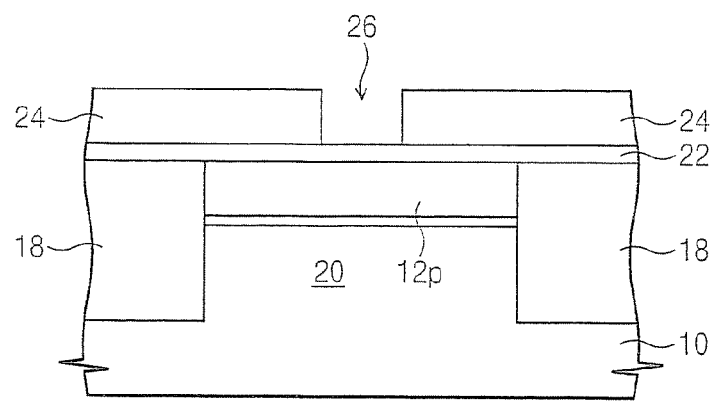
Figure 4C:
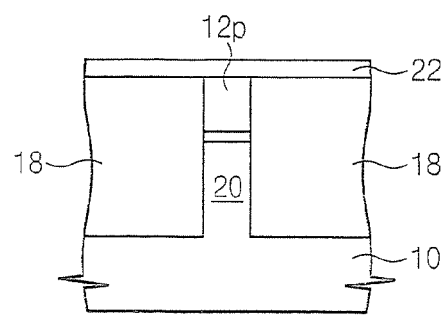

Referring now to FIGS. 4A, 4B and 4C, a sacrificial layer 22 is formed on the substrate 10 including the device isolation layer 18. A photoresist pattern 24 having a gate opening 26 is then formed on the sacrificial layer 22. The gate opening 26 crosses over a middle portion of the fin 20. The sacrificial layer 22 may be formed of the same material as the hard mask layer 12. In addition, the sacrificial layer 22 may be formed of a layer having an etch selectivity with respect to the device isolation layer 18. For example, the sacrificial layer 22 may be an amorphous silicon layer and/or a polysilicon layer.

A gate electrode covering the upper portion and both sidewalls of the fin 20 is then formed using a damascene process, as described below.

Figure 5A:
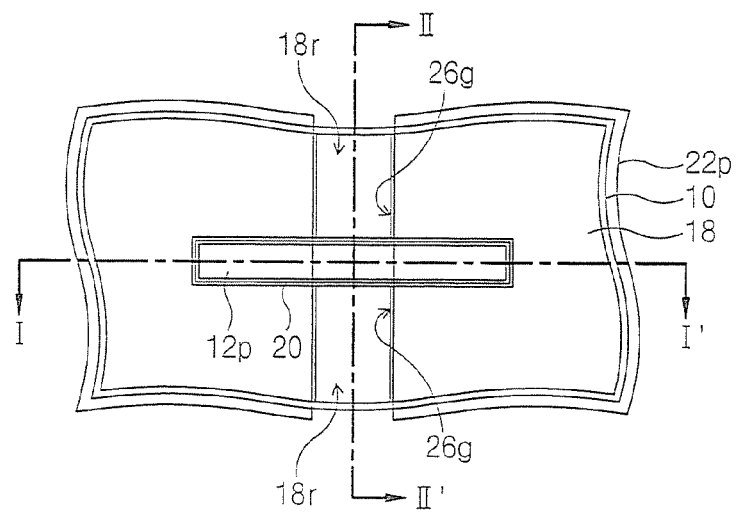
Figure 5B:
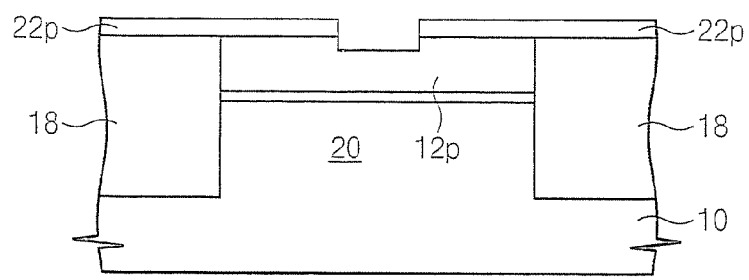
Figure 5C:
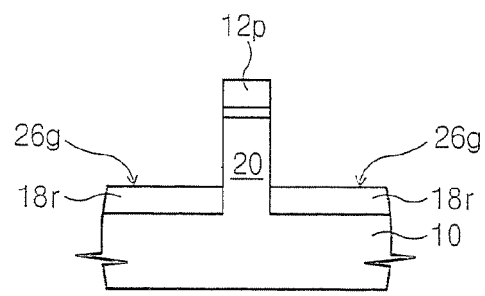

Referring to FIGS. 5A, 5B and 5C, a sacrificial pattern 22p and a gate trench/groove 26g are formed by etching the sacrificial layer 22 and the device isolation layer 18 using the photoresist pattern 24 as an etching mask. The gate groove 26g exposes both sidewalls of the fin 20. As shown in FIG. 5B, a part of the hard mask pattern 12p may also be etched. The gate groove 26g is formed such that a portion of the device isolation layer 18r remains at the bottom of the gate groove 26g. A channel region may be formed in the fin 20 by implanting impurities into the sidewalls of the fin 20 exposed by the gate groove 26. The photoresist pattern 24 is then removed. Alternatively, the photoresist pattern 24 may be etched after forming the sacrificial pattern 22p. In this case, the gate groove 26g may be formed using the sacrificial pattern 22p as an etching mask.

Figure 6A:
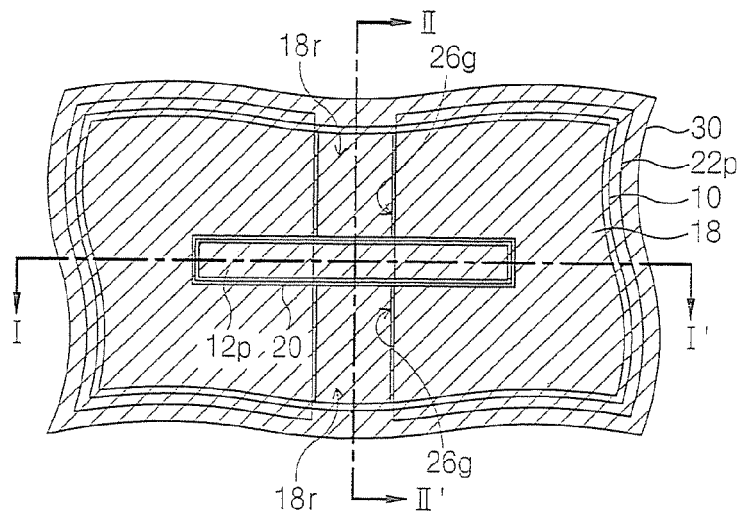
Figure 6B:
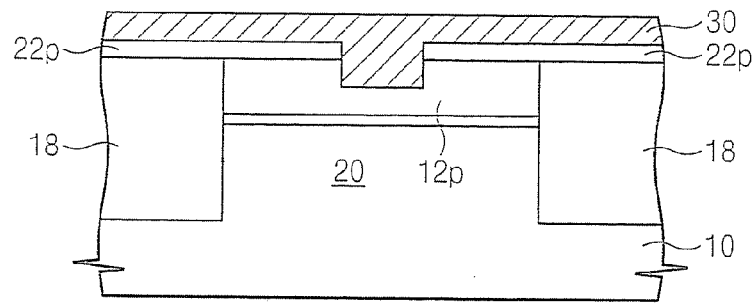
Figure 6C:
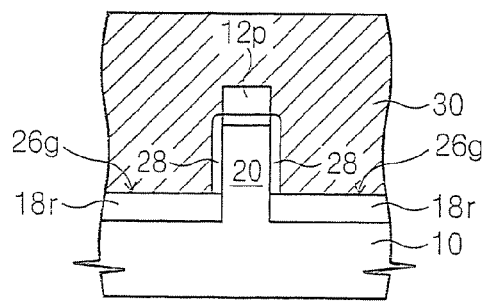

Referring to FIGS. 6A, 6B and 6C, a gate insulation layer 28 is formed on a the sidewalls of the fin 20 exposed by the gate groove 26g. A conductive layer 30 is formed on an entire surface of the substrate 10 including the gate insulation layer 28, filling the gate groove 26g. The conductive layer 30 may be formed of various conductive materials, such as a polysilicon layer, a polycide layer, and/or a metal layer.

Figure 7A:
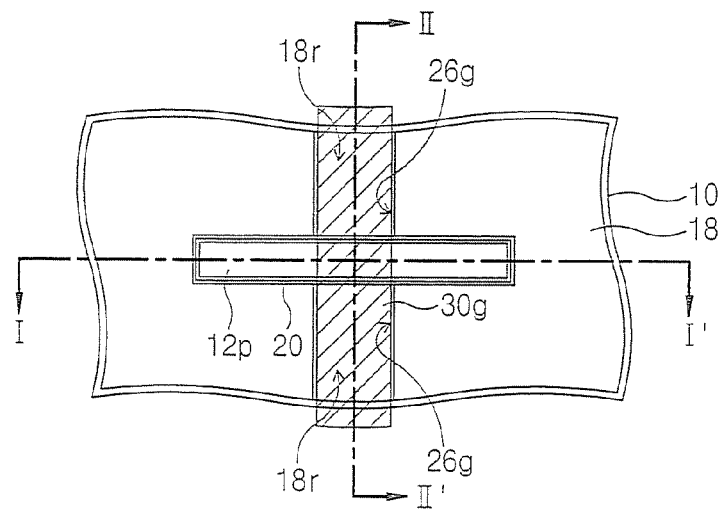
Figure 7B:
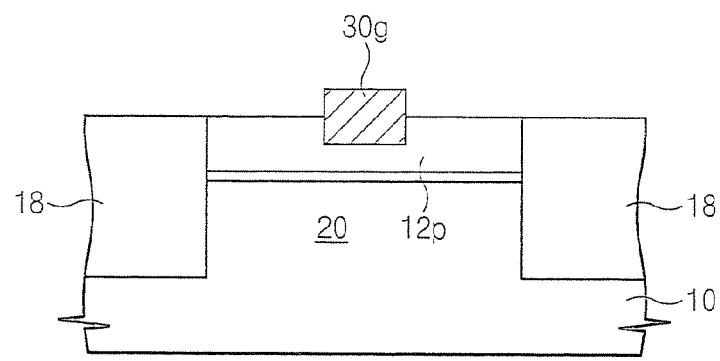
Figure 7C:
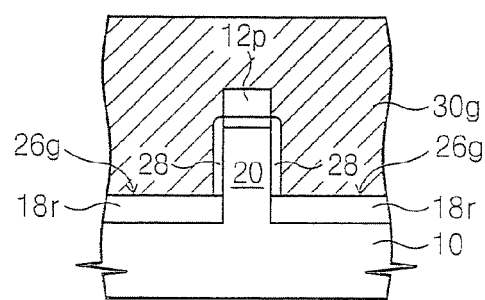

Referring to FIGS. 7A, 7B and 7C, the conductive layer 30 is recessed to form the gate electrode 30g in the gate groove 26g. The conductive layer 30 may be recessed by an etch-back process. Alternatively, the conductive layer 30 may be recessed using chemical mechanical polishing (CMP). The sacrificial pattern 22p at both sides of the gate electrode 30g is also removed to expose sidewalls of the gate electrode 30g. If the sacrificial pattern 22p is formed of a material having similar polishing and etching rates as compared to the gate electrode 30g, the sacrificial pattern 22p may also be etched-back at the same time as the conductive layer 30.

Figure 8A:
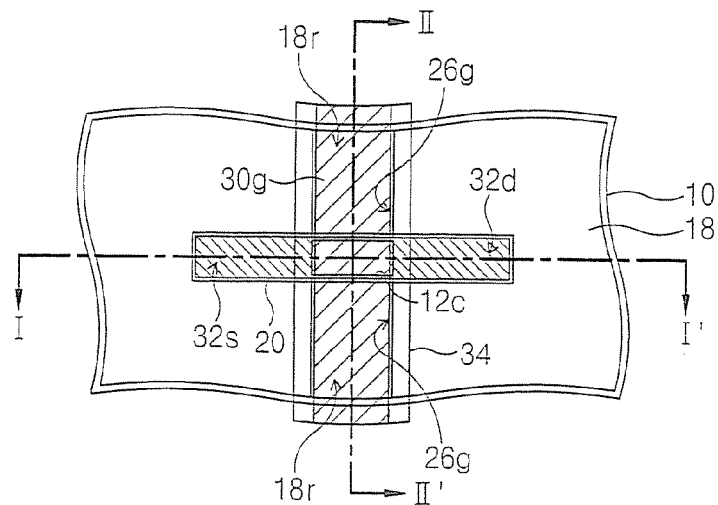
Figure 8B:
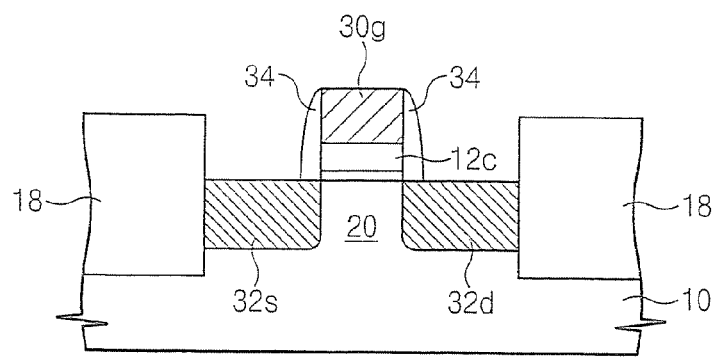
Figure 8C:
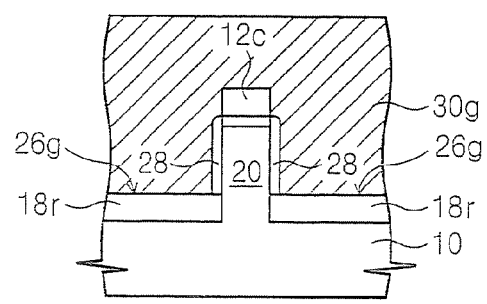

Referring now to FIGS. 8A, 8B and 8C, the hard mask pattern 12p is etched using the gate electrode 30g as an etching mask. The hard mask pattern 12p is removed to expose the upper portion of the fin 20 at both sides of the gate electrode 30g, but a portion of hard mask pattern remains between the gate electrode 30g and the fin 20 to form a capping layer 12c. Source/drain regions 32s and 32d are respectively formed in the fin 20 at both sides of the gate electrode 30g by implanting impurities into the fin 20 using the gate electrode as an ion implantation mask. Sidewall spacers 34 are formed at both sidewalls of the gate electrode 30g. The sidewall spacers 34 cover the sidewalls of the gate electrode 30g and the capping layer 12c on the upper portion of the fin 20. Additionally, the sidewalls spacers 34 extend to cover the sidewalls of the gate electrode 30g along the upper portion of the device isolation layer 18.

The device isolation layer 18 is then etched using the sidewall spacers 34 and the gate electrode 30g as an etching mask to expose sidewalls of the fin 20 on opposite sides of the gate electrode, as shown in FIGS. 1A, 1B, and 1C. The device isolation layer 18 is aligned with the sidewall spacer 34 and recessed so that the sidewalls of the fin 20 are exposed, thereby exposing source/drain regions 32s and 32d at the sidewalls of the fin 20. Accordingly, the exposed surface area of the source/drain regions 32s and 32d can be increased, thereby allowing for reduced contact resistance.

The source/drain regions 32s and 32d may be formed before or after the sidewall spacers 34 are formed, as well as after recessing the device isolation layer 18. The source/drain regions 32s and 32d may be formed using an oblique ion implantation method. In addition, the surface area of the source/drain regions 32s and 32d to be exposed at the sidewalls of the fin 20 may be adjusted by controlling the implantation depth. The surface area of the source/drain regions 32s and 32d may also be adjusted based on the recessed depth of the device isolation layer 18. However, oblique ion implantation may not be applicable prior to forming the sidewall spacers 34, because the upper portion of the fin 20 is exposed. As such, where a projection range Rp is used, ions may be diffused under the gate 30g in a thermal annealing process to form a uniform ion profile. Accordingly, it may be possible to prevent ions from being diffused under the gate 30g by controlling implantation depth, implanting ions by swiping implantation energy and applying rapid thermal annealing.

After forming the sidewall spacers 34, the distance between the ion implantation region and the gate 30g is covered by the sidewall spacers 34. Accordingly, after implanting ions in a projection range Rp, they may be thermally diffused. In other words, the spacers 34 may prevent ions from being diffused under the gate 30g. However, the same ion implantation method used before forming the sidewall spacer 34 may also be used.

As a further alternative, after the device isolation layer 18 is recessed, source/drain regions 32s and 32d may be formed using any of the above-mentioned methods.

As a result, as shown in FIGS. 1A, 1B and 1C, the source/drain regions 32s and 32d are exposed at sidewalls and at an upper surface of the fin 20, so that the exposed surface area of the source/drain regions 32s and 32d can be increased regardless of the width of the fin 20. Accordingly, when respective source/drain contacts are formed and connected to the source/drain regions 32s and 32d in subsequent processes, contact resistance can be reduced despite scale-down of the fin 20 by electrically connecting the source/drain contacts with the exposed upper surface and sidewalls of the source/drain regions 32s and 32d in the fin 20.

In addition, although not shown, a silicide layer may be further formed on the surface of the source/drain regions 32s and 32d, that is, on the exposed upper surface and sidewalls of the fin 20. Also, the silicide layer may be further formed on the upper surface of the gate electrode 30g.

Figure 9A:
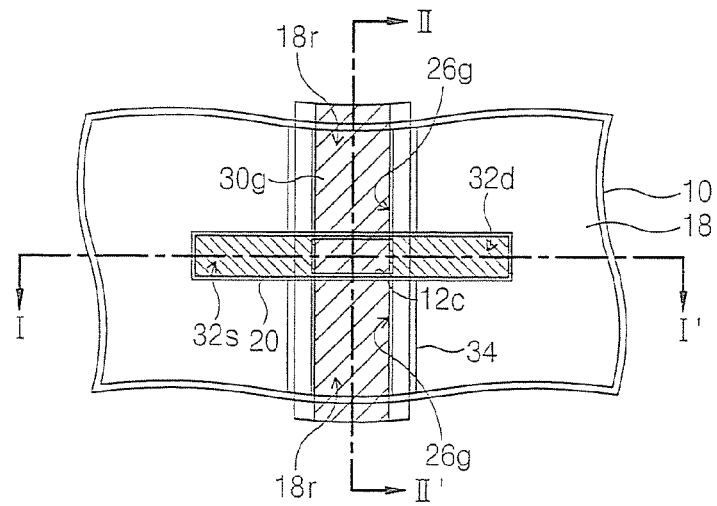
FIG. 9A is a plan view illustrating FinFETs according to other embodiments of the present invention.
Figure 9B:
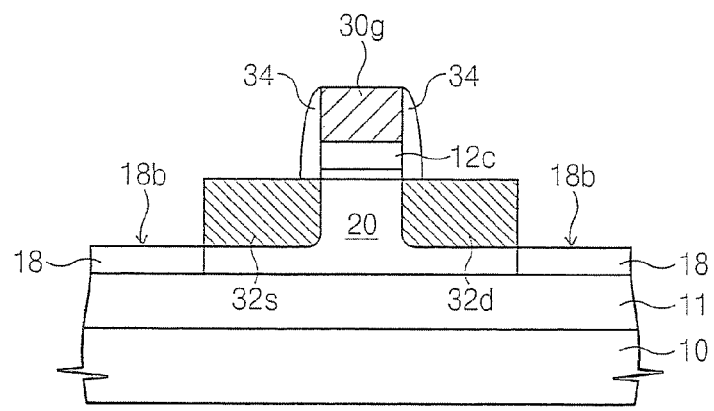
FIG. 9B is a cross-sectional view taken along line I-I' of FIG. 9A.
Figure 9C:
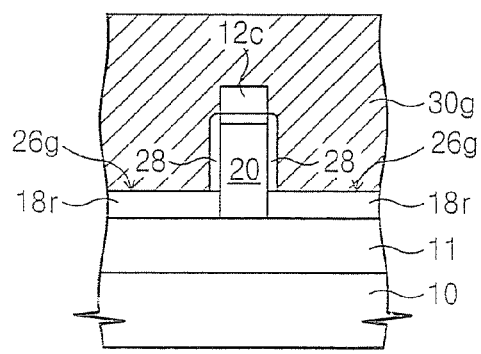
FIG. 9C is a cross-sectional view taken along line II-II' of FIG. 9A.

A transistor according to some embodiments of the present invention may be formed on a bulk substrate, as well as on a SOI (Silicon-On-Insulator, or Semiconductor-On-Insulator) substrate. FIG. 9A is a plan view illustrating FinFETs according to some embodiments of the present invention formed on a SOI substrate. FIG. 9B is a cross-sectional view taken along line I-I' of FIG. 9A. FIG. 9C is a cross-sectional view taken along line II-II' of FIG. 9A.

Referring now to FIGS. 9A, 9B and 9C, the SOI substrate comprises a base substrate 10, a buried insulation layer 11 formed on the base substrate 10 and a semiconductor layer on the buried insulation layer 11. The semiconductor layer may be formed of silicon, silicon-germanium, or a graded silicon, where the lattice distance of silicon is increased. The semiconductor layer is patterned to form a vertically protruding fin 20 on the buried insulation layer 11. A device isolation layer 18 encloses sidewalls of the fin 20. The device isolation layer 18 includes a gate groove 26g, which exposes a portion of the fin 20. A gate electrode 30g fills the gate groove 26g and covers the upper portion and both sidewalls of the fin 20 exposed by the gate groove 26g. The bottom of the gate groove 26g is composed of a recessed device isolation layer 18r. A capping layer 12c is positioned between the gate electrode 30g and the upper portion of the fin 20, and a gate insulation layer 28 is positioned between the gate electrode 30g and both sidewalls of the fin 20 to form a double-gate structure. Sidewall spacers 34 are formed at both sidewalls of the gate electrode 30g. Source/drain regions 32s and 32d are formed in the fin 20 at opposite sides of the gate electrode 30g. The device isolation layer 18 is aligned with the sidewall spacers 34 and recessed to form a recessed portion 18b, or alternatively, to be removed completely. Accordingly, at least a portion of the sidewalls of the fin 20 is exposed, thereby exposing the source/drain regions 32s and 32d at the exposed sidewalls. Therefore, the exposed surface of the source/drain regions 32s and 32d may be greater than the thickness of the fin 20. In other words, the surface area of the exposed upper surface and sidewalls of the source/drain regions 32s and 32d may be greater than the surface area provided by the upper surface alone, which is limited by the width of the fin 20. Although not shown, source/drain contacts may be respectively formed on the source/drain regions 32s and 32d, and thus may be in contact with the upper surface and the exposed sidewalls of the fin 20. In other words, even as fin width/thickness is scaled-down, the exposed source/drain regions 32s and 32d provide a greater contact area for the source/drain contacts, i.e. at both sidewalls of the fin 20 as well as at the upper surface, thereby reducing resistance. In addition, if a silicide layer is formed on the exposed surface of the source/drain regions 32s and 32d and the gate electrode 30g, resistance may be further reduced. The bottom of the gate groove 26g may be the recessed device isolation layer 18r, which may be recessed to a greater extent than a peripheral region.

However, if the device isolation layer 18r is completely removed, the bottom of the gate groove 26g may be the buried insulation layer 11.

Figure 10A:
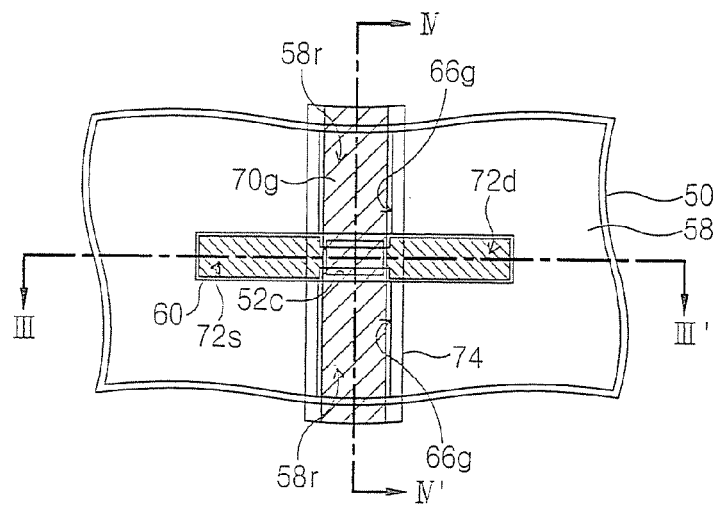
FIG. 10A is a plan view illustrating FinFETs according to further embodiments of the present invention.
Figure 10B:
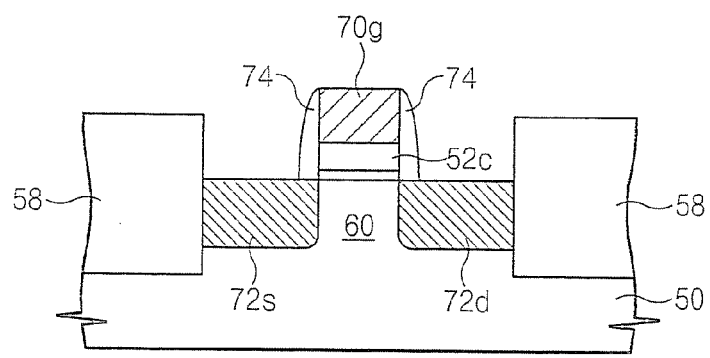
FIG. 10B is a cross-sectional view taken along line III-III' of FIG. 10A.
Figure 10C:
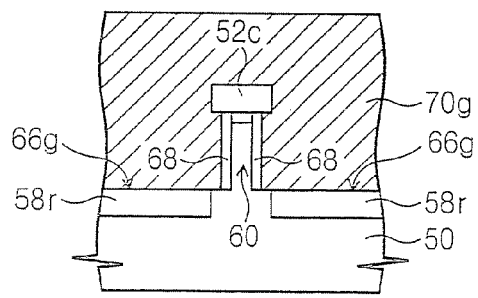
FIG. 10C is a cross-sectional view taken along line IV-IV' of FIG. 10A.

FIG. 10A is a plan view illustrating FinFETs according to further embodiments of the present invention. FIG. 10B is a cross-sectional view taken along line III-III' of FIG. 10A. FIG. 10C is a cross-sectional view taken along line IV-IV' of FIG. 10A.

Referring now to FIGS. 10A, 10B and 10C, a vertically protruding fin-shaped active region 60 is formed on a semiconductor substrate 50. A device isolation layer 58 including a gate groove 66g covers sidewalls of the fin 60. A gate electrode 70g fills the gate groove 66g and covers an upper portion and both sidewalls of the fin 60. A capping layer 52c is positioned between the gate electrode 70g and the upper portion of the fin 60. A gate insulation layer 68 is positioned between the gate electrode 70g and each sidewall of the fin 60 to define a double-gate structure. Sidewall spacers 74 are formed at both sidewalls of the gate electrode 70g. Source/drain regions 72s and 72d are respectively formed in the fin 60 at opposite sides of the gate electrode 70g. The fin 60 may therefore include a first portion covered by and/or under the gate electrode 70g and a second portion where the source/drain regions 72s and 72d are formed. The portion covered by the gate electrode 70g may be self-aligned with the gate electrode 70g, and may have a narrower width than the portion where the source/drain regions 72s and 72d are formed. A channel region is formed in the fin 60 between the source/drain regions 72s and 72d, i.e. in the portion of the fin 60 covered by the gate electrode 70g. Accordingly, the channel region may also be self-aligned with the gate electrode 70g. As such, the width of the source/drain regions 72s and 72d may be greater than the width of the channel region, i.e. greater than the width of the portion of the fin 60 covered by the gate electrode 70g in a direction parallel to the gate electrode. In other words, even if the channel region in the fin 60 is scaled-down, the portion of the fin 60 where the source/drain regions 72s and 72d are formed may be increased in width, thereby providing an increased contact surface area and reduced resistance. In addition, resistance may be further reduced by forming a silicide layer on the exposed source/drain regions 72s and 72d and the gate electrode 70g.

FIGS. 11A to 16A are plan views illustrating exemplary operations for fabricating FinFETs according to further embodiments of the present invention. FIGS. 11B to 16B are cross-sectional views taken along line III-III' of FIGS. 11A to 16A, respectively. FIGS. 11C to 16C are cross-sectional views taken along line IV-IV' of FIGS. 11A to 16A.

Figure 11A:
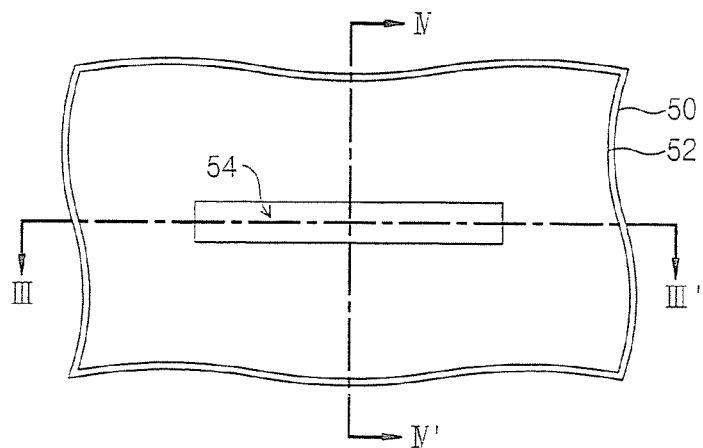
Figure 11B:
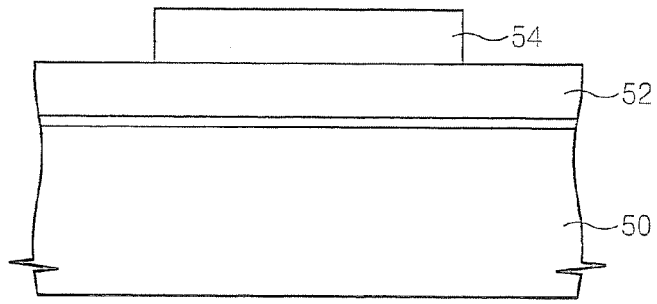
Figure 11C:
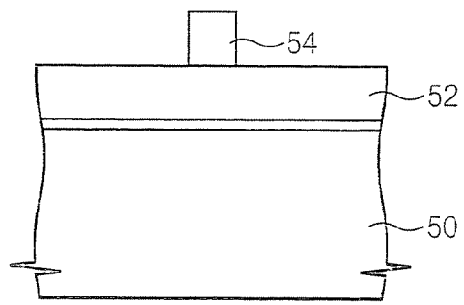

Referring to FIGS. 11A, 11B and 11C, a hard mask layer 52 is formed on a semiconductor substrate 50. A photoresist pattern 54 is formed so as to form a fin on the hard mask layer 52.

Figure 12A:
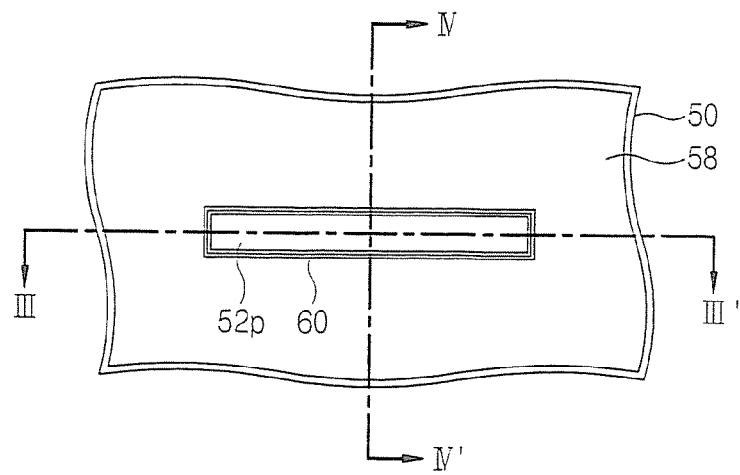
Figure 12B:
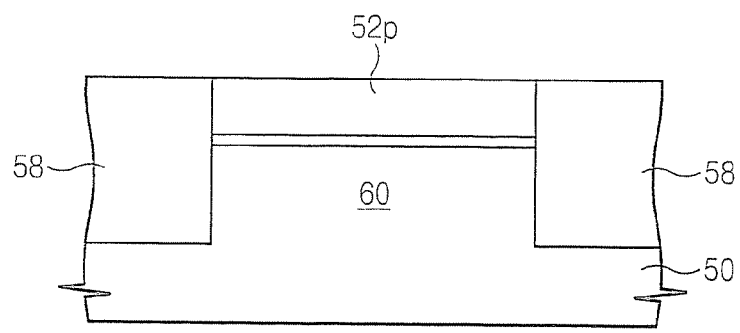
Figure 12C:
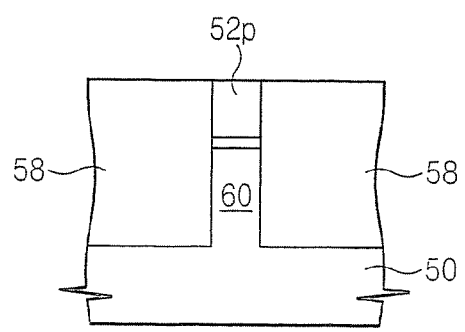

Referring to FIGS. 12A, 12B and 12C, the hard mask layer 52 and the semiconductor substrate 50 are patterned using the photoresist pattern 54 as an etching mask to define a fin 60 vertically protruding from the substrate 50 and a device isolation region. A hard mask pattern 52p is formed on an upper portion of the fin 60. The photoresist pattern 54 is removed. Alternatively, the photoresist pattern 54 may be removed after patterning only the hard mask pattern 52p. In this case, the semiconductor substrate 50 may be patterned using the hard mask pattern 52p as an etching mask. An insulation layer is then formed on an entire surface of the semiconductor substrate 50, filling the device isolation region. Then, the insulation layer is polished by CMP to expose the hard mask pattern 52p and to form a device isolation layer 58 in the device isolation region.

Figure 13A:
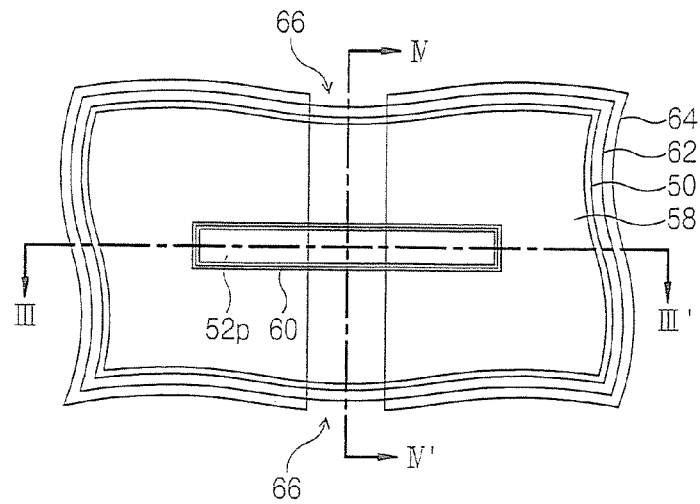
Figure 13B:
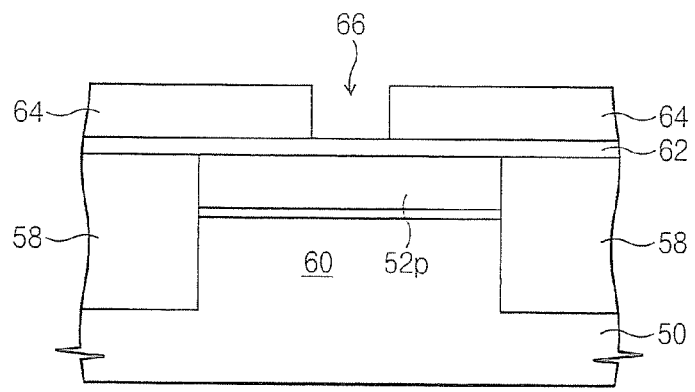
Figure 13C:
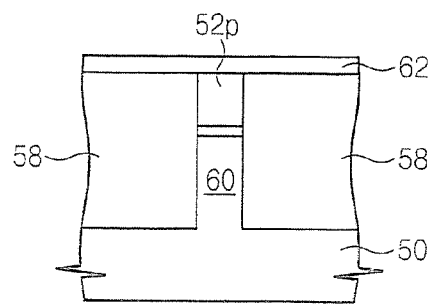

Referring to FIGS. 13A, 13B and 13C, a sacrificial layer 62 is formed on a substrate where the device isolation layer 58 is formed. A photoresist pattern 64 having a gate opening 66 is formed on the sacrificial layer 62. The gate opening 66 crosses over the fin 60. The sacrificial layer 62 has an etch selectivity with respect to the device isolation layer 58 and may be formed of the same material as the hard mask layer 52. For example, the sacrificial layer 62 may be formed of polysilicon or amorphous silicon.

A gate electrode covering the upper portion and both sidewalls of the fin 20 is then formed using a damascene process, as described below.

Figure 14A:
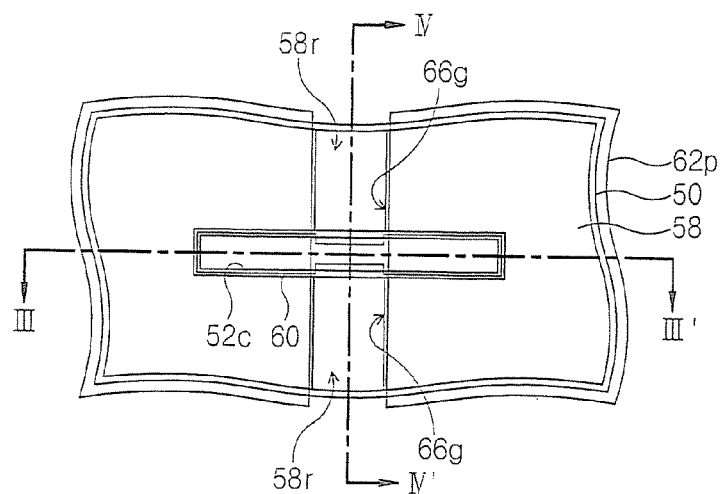
Figure 14B:
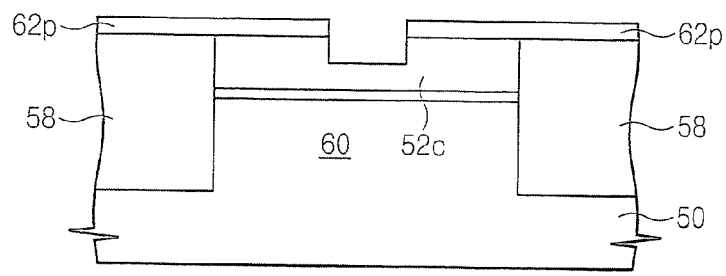
Figure 14C:
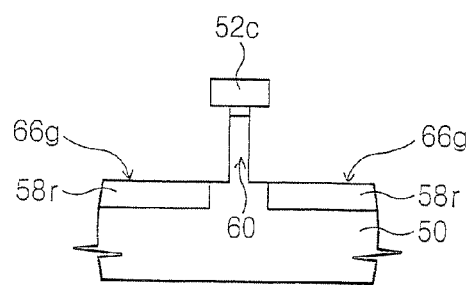

Referring now to FIGS. 14A, 14B and 14C, the sacrificial layer 62 is etched using the photoresist pattern 64 as an etching mask to form a gate groove 66g and a sacrificial pattern 62p. The gate groove 66g exposes both sidewalls and an upper surface of the fin 60. As shown in FIG. 14B, the hard mask pattern 52p may be partially etched. The gate groove 66g is formed to provide a trench in order to form a gate electrode surrounded by the device isolation layer 58. The photoresist pattern 64 is then removed. Alternatively, the photoresist pattern 64 may be removed after forming the sacrificial pattern 62p.

The sidewalls of the fin 60 exposed by the gate groove 66g are then recessed, thereby reducing the thickness of the portion of the fin 60 exposed by the gate groove 66g. i.e. the portion of the fin 60 to be covered by the gate electrode. The fin 60 may be recessed using an isotropic etch process or by removing an oxide layer formed by thermal oxidation. Where isotropic etching is used, the sidewalls of the fin 60 may be recessed by controlling the concentration of etchant and the etching time. The fin may be recessed at one side by forming a polymer at sidewalls of an etched portion. Alternatively, if a thermal oxidation layer is grown on an exposed surface of the fin 60 by a thermal oxidation process and then removed, the thickness of the fin 60 may be reduced based on the reaction to the oxidation process. After the sidewalls of the fin 60 have been recessed, a channel region may be formed by implanting impurities into the exposed sidewalls of the fin 60.

Figure 15A:
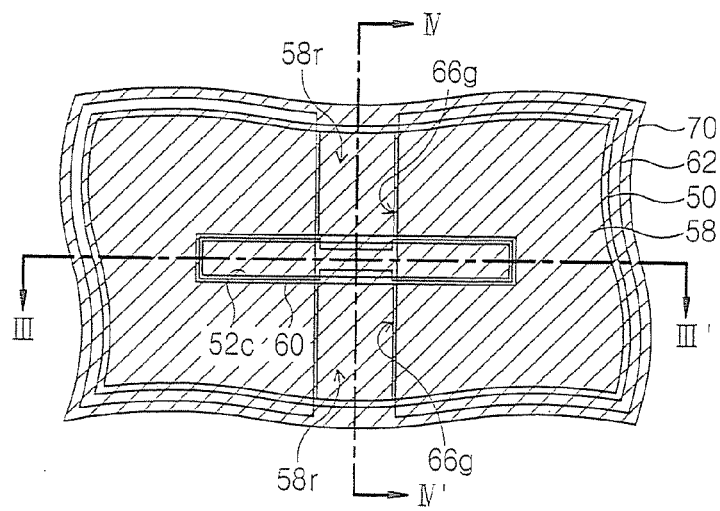
Figure 15B:
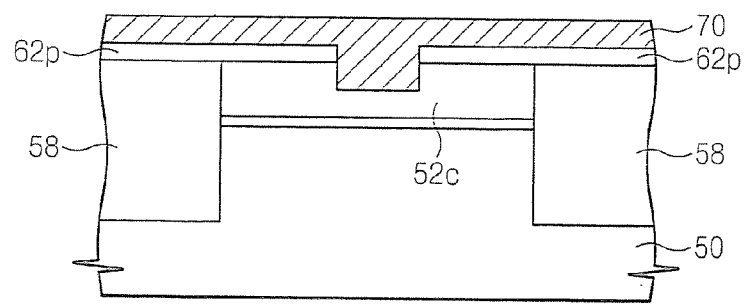
Figure 15C:
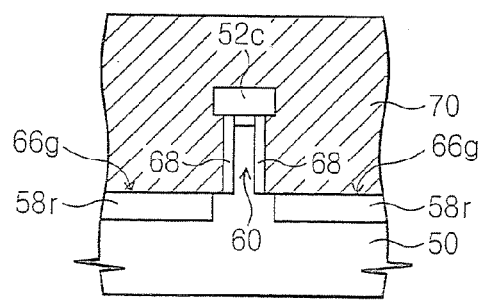

Referring to FIGS. 15A, 15B and 15C, a gate insulation layer 68 is formed on sidewalls of the fin 60 exposed by the gate groove 66g. A conductive layer 70 is formed on an entire surface of the substrate 50, filling the gate groove 66g where the gate insulation layer 68 is formed. The conductive layer 70 may be formed of a variety of materials, based on a desired conductivity for a particular application. For example, the conductive layer 70 may be a polysilicon layer, a polycide layer or a metal layer.

Figure 16A:
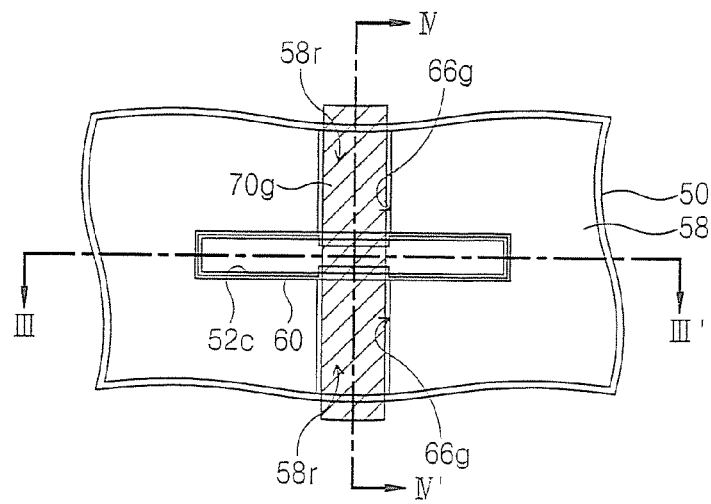
Figure 16B:
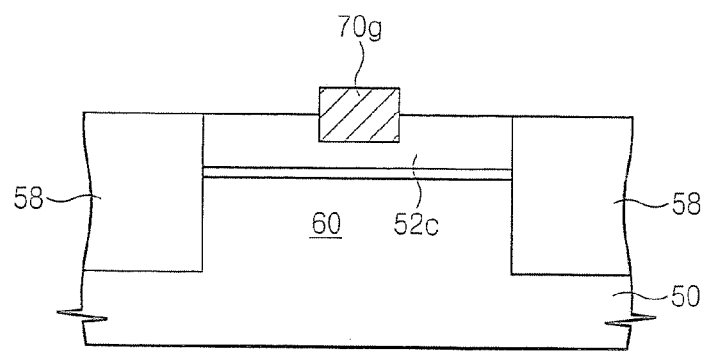
Figure 16C:
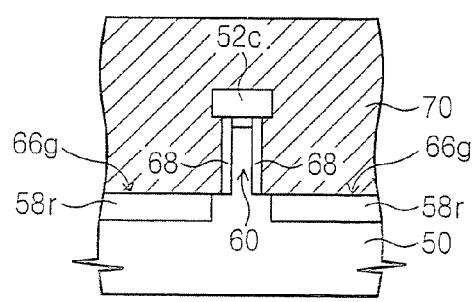

Referring to FIGS. 16A, 16B and 16C, the conductive layer 70 is recessed to form a gate electrode 70g in the gate groove 66g. The conductive layer 70 may be recessed by an etch-back process or CMP. The sacrificial pattern 62p is removed to expose sidewalls of the gate electrode 70g. If the conductive layer 70 is formed of the same material as the sacrificial pattern 62p, the sacrificial layer 62p may be recessed during the etch-back or CMP process used to form the gate electrode 70g.

Although not shown, the hard mask pattern 52p is etched using the gate electrode 70g as an etching mask to form a capping layer 52c, and impurities are implanted into the fin using the gate electrode 70g as an ion implantation mask, so that source/drain regions 72s and 72d are formed in the fin at opposite sides of the gate electrode 70g. As shown in FIGS. 10A, 10B, and 10C, sidewall spacers 74 may be formed at both sidewalls of the gate electrode 70g. The portion of the fin 60 where the source/drain regions 72s and 72d are formed may be wider and may thereby provide a greater surface area than the portion of the fin 60 where the channel region is formed, i.e. the portion of the fin 60 that is self-aligned with the gate electrode 70g. Accordingly, despite reducing the thickness of the fin 60 at the channel region, source/drain regions 72s and 72d with reduced contact resistance may be formed.

The source/drain regions 72s and 72d may be formed before or after forming the sidewall spacers 34. However, before forming the sidewall spacers 34, the upper portion of the fin 60 is exposed. As a result, oblique ion implantation may not be suitable. In this case, if a projection range Rp is used, ions may be diffused under a gate 70g in the course of a thermal annealing process to form a uniform ion profile. Therefore, it may be possible to prevent ions from being diffused under the gate 70g by controlling implantation depth, implanting ions by swiping implantation energy or applying rapid thermal annealing.

After forming the sidewall spacers 34, the area between the ion implantation region and the gate 70g is covered by the sidewall spacers 34. At this time, ions may be thermally diffused after implanting ions in a projection range Rp. In other words, the area protected by the spacers 34 may prevent ions from being diffused under the gate 70g. However, the same ion implantation method used before forming the sidewall spacer 34 may also be used.

Although not shown, a silicide layer may also be formed on the exposed surface of the source/drain regions 72s and 72d. As such, the silicide layer may be formed on the exposed upper portion and sidewalls of the fin 60. The silicide layer may be further formed on an upper surface of the gate electrode 70g.

Figure 17A:
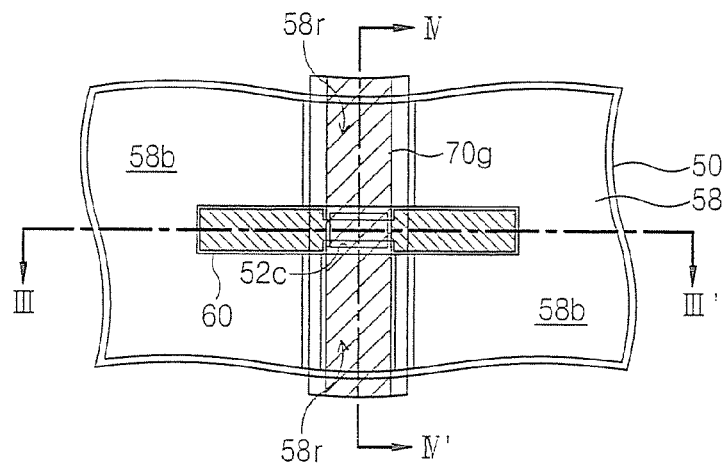
FIG. 17A is a plan view illustrating other embodiments according to the present invention.
Figure 17B:
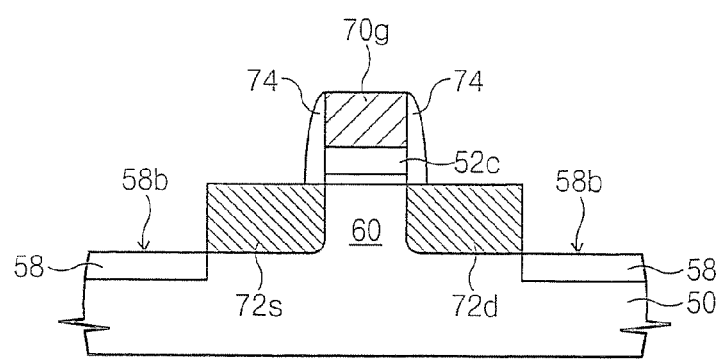
FIG. 17B is a cross-sectional view taken along line I-I' of FIG. 17A.
Figure 17C:
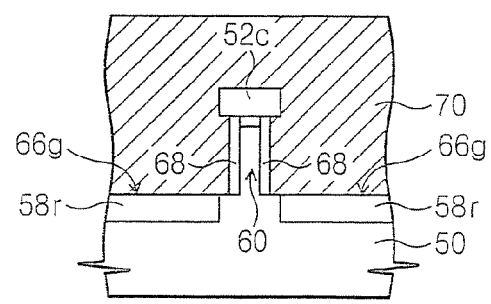
FIG. 17C is a cross-sectional view taken along line II-II' of FIG. 17A.

FIGS. 17A, 17B and 17C illustrate alternate embodiments according to the present invention. As described above, the width of the fin 60 where source/drain regions 72s and 72d are formed is greater than the width of the fin 60 where the channel region is formed. However, the sidewalls of the fin where the source/drain regions 72s and 72d are formed may be exposed, as similarly described above with reference to FIGS. 1A, 1B, and 1C.

Referring to FIGS. 17A, 17B and 17C, the hard mask pattern 52p is removed to expose an upper surface of the fin 60 at both sides of the gate electrode 70g. A portion of the hard mask pattern 52p remains between the gate electrode 70g and the fin 60 to form a capping layer 52c. The sidewall spacers 74 cover the sidewalls of the gate electrode 70g and the capping layer 52c adjacent the upper portion of the fin 60. In addition, the sidewall spacers 74 cover the sidewalls of the gate electrode 70g adjacent the device isolation layer 58. The device isolation layer 58 is then etched using the sidewall spacers 74 and the gate electrode 70g as an etching mask, to expose sidewalls of the fin 60. As the device isolation layer 58 is aligned with the sidewall spacers 74 and then recessed to expose sidewalls of the fin 60, sidewalls of the source/drain regions 72s and 72d are thereby exposed. Accordingly, the exposed surface area of the source/drain regions 72s and 72d may be increased. In some embodiments, the source/drain regions 72s and 72d may be formed after recessing the device isolation layer 58. As such, the source/drain regions 72s and 72d may also be formed using an oblique ion implantation process. Furthermore, the surface area of the source/drain regions 72s and 72d may be controlled based on the recessed depth of the device isolation layer 58.

Figure 18A:
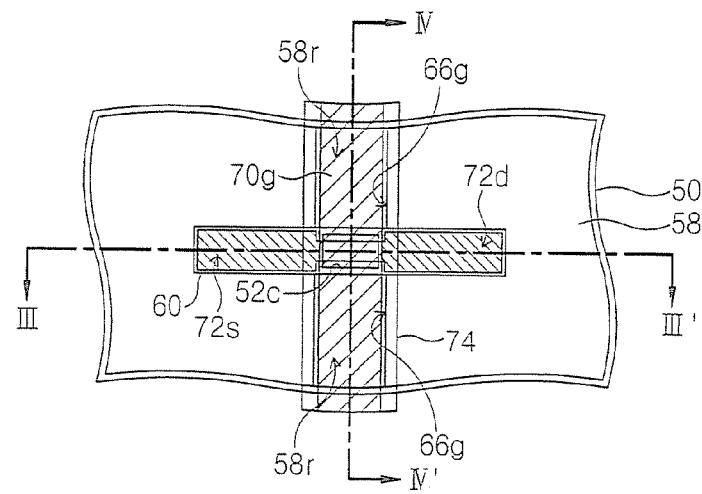
FIG. 18A is a plan view illustrating still other embodiments according to the present invention.
Figure 18B:
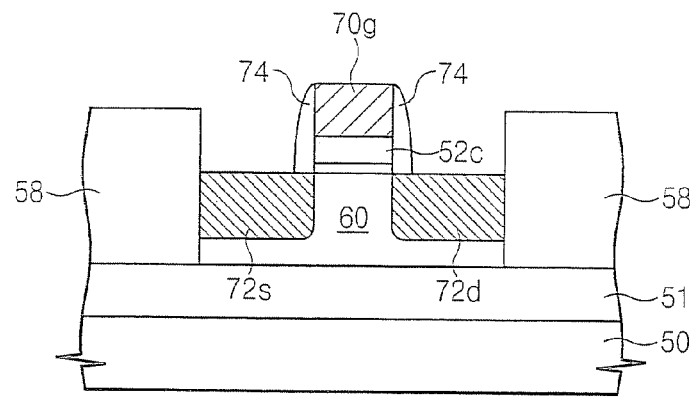
FIG. 18B is a cross-sectional view taken along line I-I' of FIG. 18A.
Figure 18C:
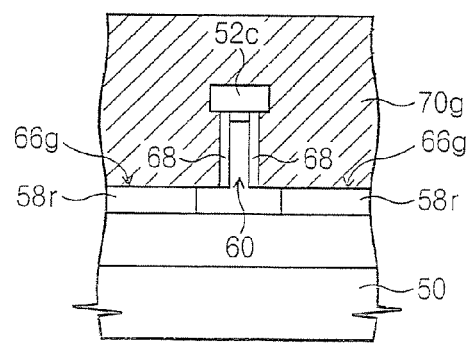
FIG. 18C is a cross-sectional view taken along line II-II' of FIG. 18A.

FIG. 18A is a plan view illustrating FinFETs according to still other embodiments of the present invention formed on a SOI substrate. FIG. 18B is a cross-sectional view taken along line I-I' of FIG. 18A. FIG. 18C is a cross-sectional view taken along line II-II' of FIG. 18A.

Referring now to FIGS. 18A, 18B and 18C, a SOI substrate comprises a base substrate 50, a buried insulation layer 51 formed on the base substrate 50, and a semiconductor layer on the buried insulation layer 51. The semiconductor layer may be formed of silicon, silicon-germanium, and/or graded silicon, where the lattice distance of silicon is increased. The semiconductor layer 50 is patterned to form a vertically protruding fin-shaped active region 60 on the buried insulation layer 51. A device isolation layer 58 including a gate groove 66g covers sidewalls of the fin 60. A gate electrode 70g fills the gate groove 66g and covers an upper portion and both sidewalls of the fin 60. A capping layer 52c is positioned between the gate electrode and the upper portion of the fin. A gate insulation layer 68 is positioned between the gate electrode 70g and both sidewalls of the fin 60. Sidewall spacers 74 are formed at both sidewalls of the gate electrode 70g. Source/drain regions 72s and 72d are formed in the fin 60 at opposite sides of the gate electrode 70g. The fin 60 may include a first portion covered by and/or under the gate electrode 70g, and a second portion where the source/drain regions 72s and 72d are formed. The portion covered by the gate electrode 70g may be self-aligned with the gate electrode 70g, and may have narrower width than the portion where the source/drain regions 72s and 72d are formed. A channel region is formed in the portion of the fin 60 covered by the gate electrode 70g. Accordingly, the channel region is self-aligned with the gate electrode 70g.

The portion of the fin 60 where the source/drain regions 72s and 72d are formed may be wider than the portion of the fin 60 covered by the gate electrode 70g in a direction parallel to the gate electrode 70g. In other words, even if the portion of the fin 60 including the channel region and covered by the gate electrode 70g is scaled-down and/or recessed, the portion of the fin 60 including the source/drain regions 72s and 72d may have a greater thickness, and thus, provide a greater contact area for source/drain contacts to be formed in a subsequent step. As a result, contact resistance at the source/drain regions 72s and 72d may be reduced. Resistance may be further reduced by forming a silicide layer on the surface of the source/drain regions 72s and 72d and the gate electrode 70g. The bottom of the gate groove 66g may formed of the recessed device isolation layer 18r rather than peripheral regions. However, if the device isolation layer 58 is completely removed so as to expose the buried insulation layer 51, the bottom of the gate groove 66g may be formed of the buried insulation layer 51. In addition, the base of the source/drain regions 72s and 72d may be the same height or higher than the gate electrode 70g at sidewalls of the fin 60, to prevent punch-through. Therefore, the source/drain regions 72s and 72d may be in contact with the buried insulation layer 51.

Figure 19A:
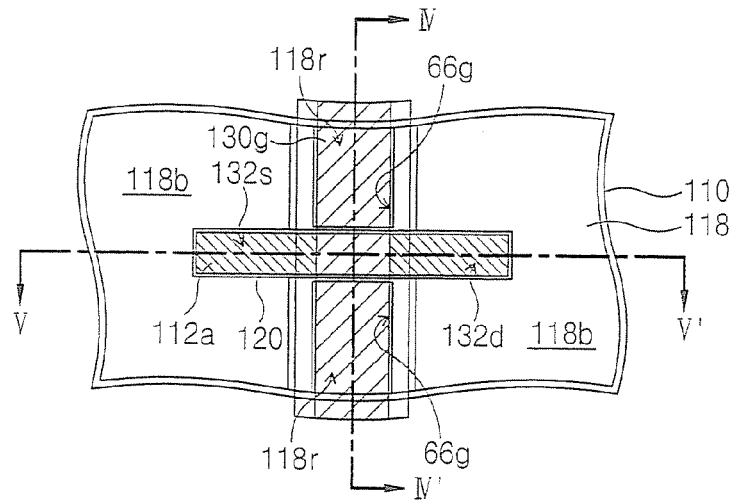
FIG. 19A is a plan view illustrating FinFETs according to still further embodiments of the present invention.
Figure 19B:
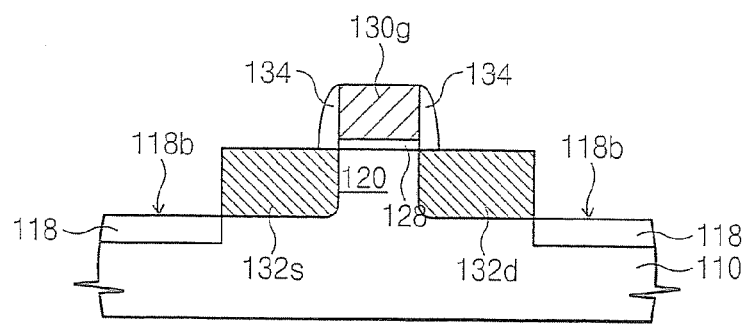
FIG. 19B is a cross-sectional view taken along line V-V' of FIG. 19A.
Figure 19C:
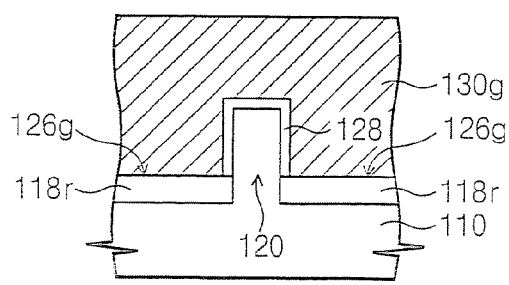
FIG. 19C is a cross-sectional view taken along line VI-VI' of FIG. 19A.

FIG. 19A is a plan view illustrating FinFETs according to still further embodiments of the present invention. FIG. 19B is a cross-sectional view taken along line V-V' of FIG. 19A. FIG. 19C is a cross-sectional view taken along line VI-VI' of FIG. 19A.

Referring to FIGS. 19A, 19B and 19C, a fin-shaped active region is formed vertically protruding from a semiconductor substrate 110. A device isolation layer including a gate groove 126g covers sidewalls of the fin 120. The bottom of the gate groove 126g is formed of a recessed isolation layer 118r. A gate electrode 130g fills the gate groove 126g and covers an upper portion and both sidewalls of the fin 120. A gate insulation layer 128 is positioned between the gate electrode 130g and the upper portion and both sidewalls of the fin 120. Unlike the embodiments of FIGS. 1A, 1B, and 1C, a channel region is formed at three surfaces of the fin 120: at both sidewalls of the fin 120 and at the upper portion of the fin 120. As such, a triple-gate structure is formed on the fin 120. Accordingly, in comparison with the embodiments of FIGS. 1A, 1B, and 1C, higher drain current can be achieved with the same fin width/thickness. Sidewall spacers 134 are formed at both sidewalls of the gate electrode 130g. Source/drain regions 132s and 132d are formed in the fin 120 at opposite sides of the gate electrode 130g. The device isolation layer 118 is aligned with the sidewall spacers 134 and recessed to form a recessed device isolation layer 118b. Accordingly, sidewalls of the fin 120 are partially exposed, and as such, the surfaces of the source/drain regions 132s and 132d are exposed at the exposed sidewalls. Therefore, the exposed surfaces of the source/drain regions 132s and 132d may be greater than the thickness of the fin 120 in a direction parallel to the gate electrode 130g. Although not shown, source/drain contacts may be respectively formed on the source/drain regions 132s and 132d. The source/drain contacts may in contact with the upper portion and the exposed sidewalls of the fin where the source/drain regions 132s and 132d are formed. In other words, even as fin width/thickness is scaled-down, the exposed source/drain regions 132s and 132d provide a greater contact area for the source/drain contacts, i.e. at both sidewalls of the fin 120 as well as at the upper surface of the fin 120. As a result, contact resistance may be reduced due to the greater contact surface area. Resistance may be further reduced by forming a silicide layer on the exposed surfaces of the source/drain regions 132s and 132d and the gate electrode 130g.

FIGS. 20A to 25A are plan views illustrating exemplary operations for forming FinFETs according to still further embodiment of the present invention. FIGS. 20B to 25B are cross-sectional views taken along line V-V of FIGS. 20A to 25A. FIGS. 20C to 25C are cross-sectional views taken along line VI-VI' of FIGS. 20A to 25A.

Figure 20A:
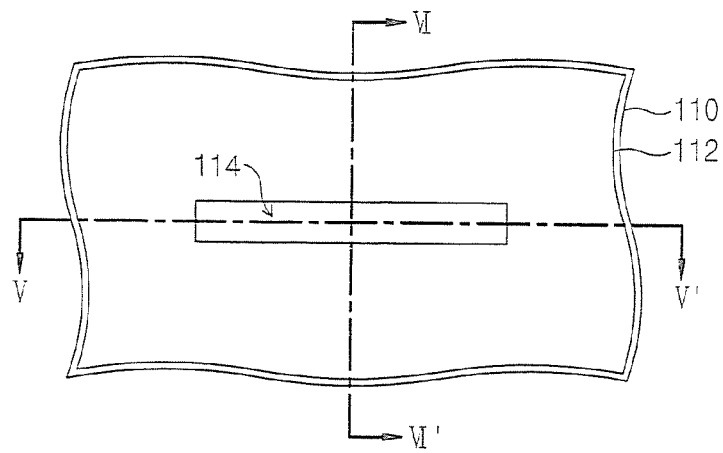
Figure 20B:
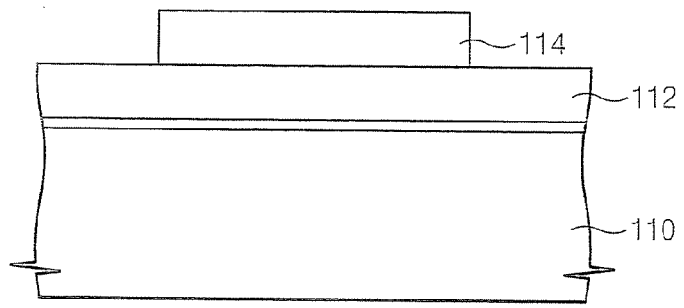
Figure 20C:
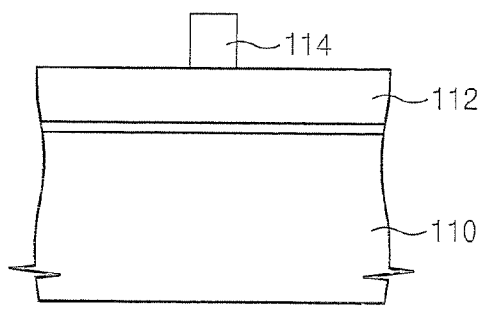

Referring to FIGS. 20A, 20B and 20C, a hard mask layer 112 is formed on a semiconductor substrate 110. A photoresist pattern 114 for forming a fin is formed on the hard mask layer 112.

Figure 21A:
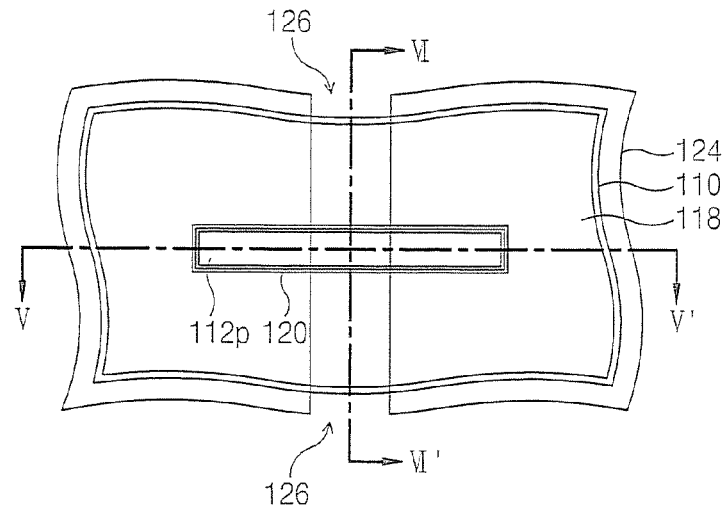
Figure 21B:
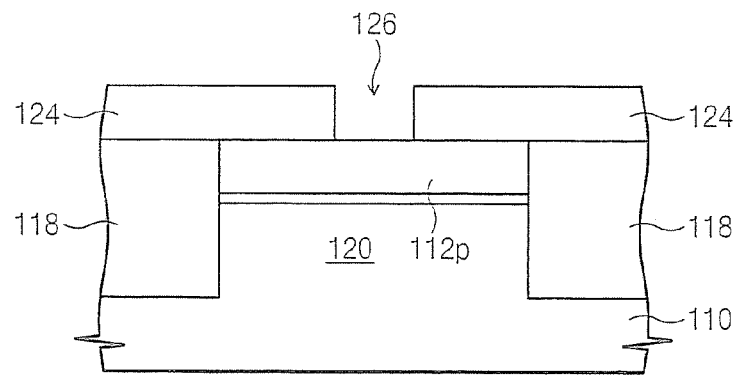
Figure 21C:
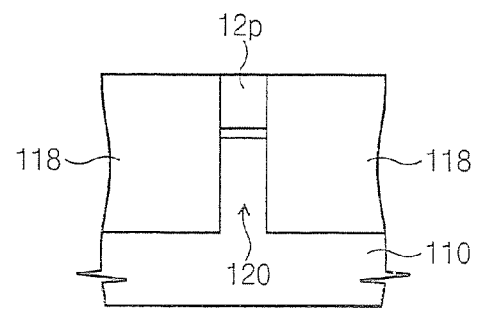

Referring to FIGS. 21A, 21B and 21C, the hard mask layer 112 and the semiconductor substrate 110 are patterned using the photoresist pattern 114 as an etching mask to define a vertically protruding fin-shaped active region 120 and a device isolation region. A hard mask pattern 112p is formed on the fin 120. The photoresist pattern 114 is then removed. An insulation layer is formed on an entire surface of the semiconductor substrate 110, filling the device isolation region. Then, the insulation layer is polished by CMP to expose the hard mask pattern 112p and form a device isolation layer 118 in the device isolation region.

A photoresist pattern 124 having a gate opening 126 is formed on the substrate 110 including the device isolation layer 118. The gate opening 126 crosses over the fin 120. In some embodiments, a sacrificial layer may be formed on the substrate 110 prior to forming the photoresist pattern 124. The sacrificial layer may be formed of the same material as the hard mask layer 112.

A gate electrode is then formed covering the upper portion and both sidewalls of the fin 120 using a damascene process, as described below.

Figure 22A:
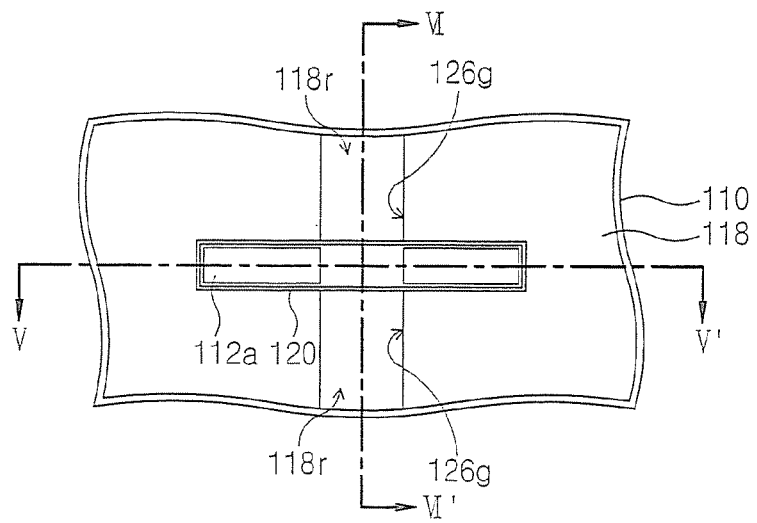
Figure 22B:
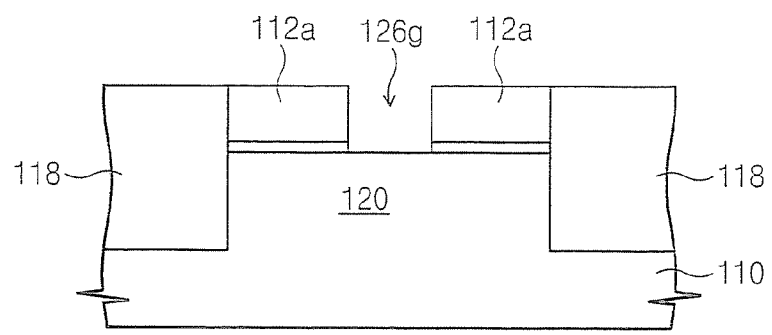
Figure 22C:
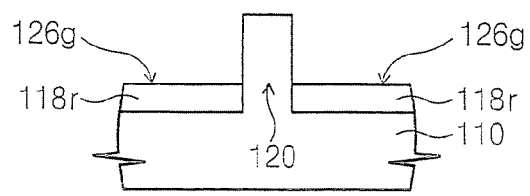

Referring now to FIGS. 22A, 22B and 22C, the device isolation layer 118 is etched using the photoresist pattern 124 as an etching mask to form a gate groove 126g. The gate groove 126g exposes both sidewalls of the fin 120. The portion of the hard mask pattern 112p exposed by the gate groove 126g is also removed, so that only a residual hard mask pattern 112a remains at both sides of the gate groove 126g. The gate groove 126g is formed such that a recessed device isolation layer 118r remains bottom of the gate groove 126g. A channel region may be formed by implanting impurities into the exposed sidewalls of the fin 120. The channel region may also be formed by ion implantation after forming the fin 120. The photoresist pattern 124 is then removed.

Figure 23A:
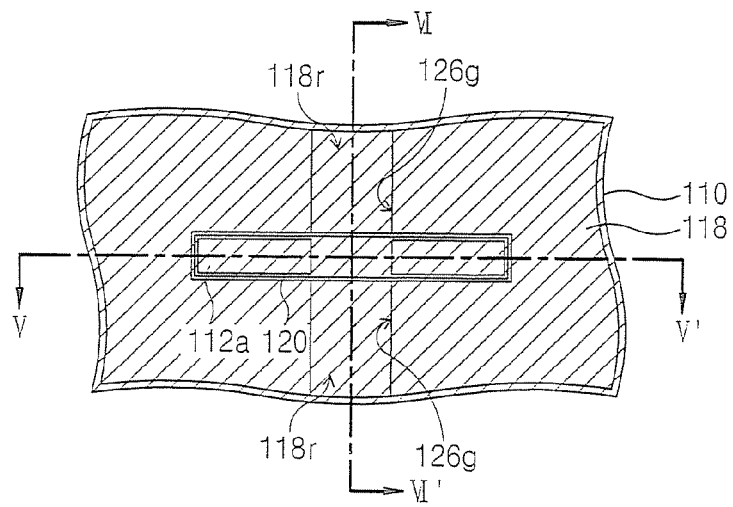
Figure 23B:
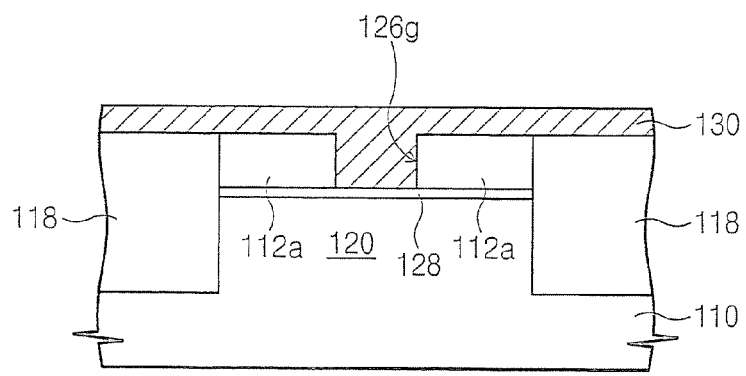
Figure 23C:
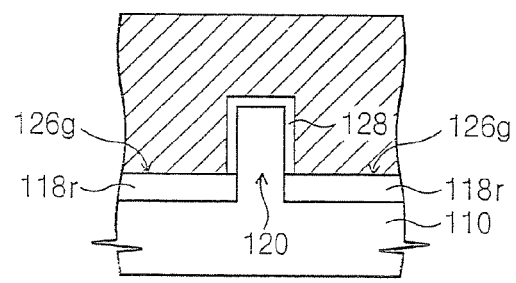

Referring to FIGS. 23A, 23B and 23C, a gate insulation layer 128 is formed on an upper surface and on sidewalls of the portion of the fin 120 exposed by the gate groove 126g. A conductive layer 130 is then formed on an entire surface of a substrate 110, filling the gate groove 126g where the gate insulation layer 128 is formed. The conductive layer 130 may be formed of a variety of materials depending on a desired conductivity for a particular application. For example, the conductive layer 130 may be a polysilicon layer, a polycide layer and/or a metal layer.

Figure 24A:
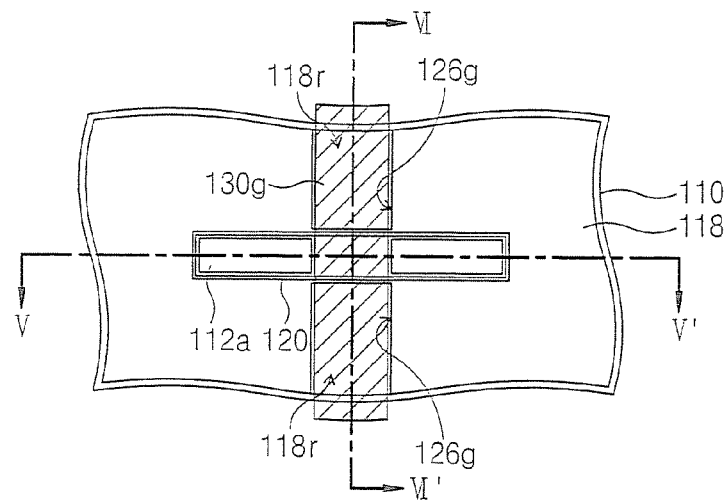
Figure 24B:
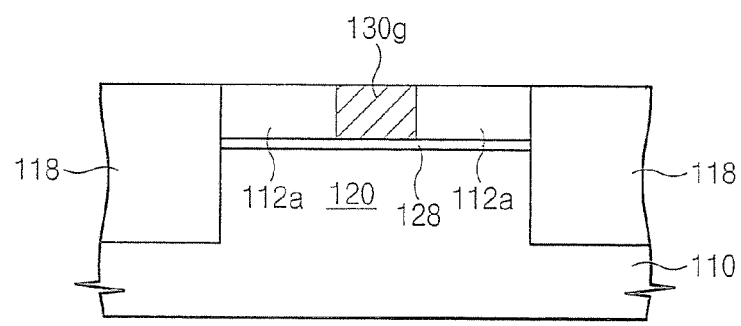
Figure 24C:
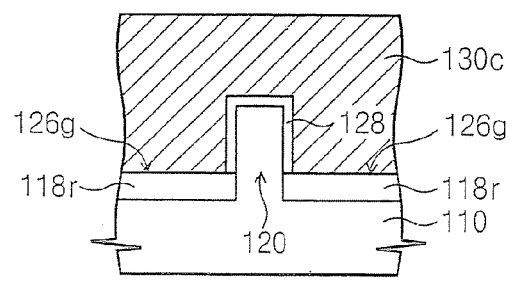

Referring to FIGS. 24A, 24B and 24C, the conductive layer 130 is recessed to form a gate electrode 130g in the gate groove 126g. The conductive layer 130 may be recessed by an etch-back process or a CMP process. The residual hard mask pattern 112a is exposed at both sides of the gate electrode 130g.

Figure 25A:
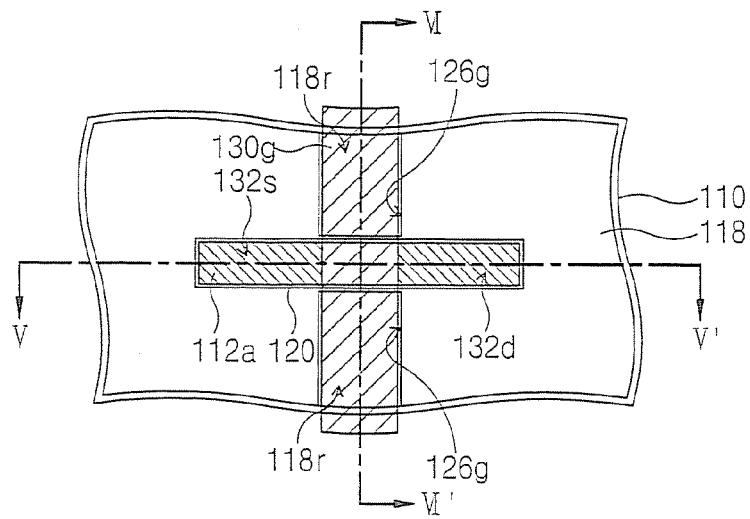
Figure 25B:
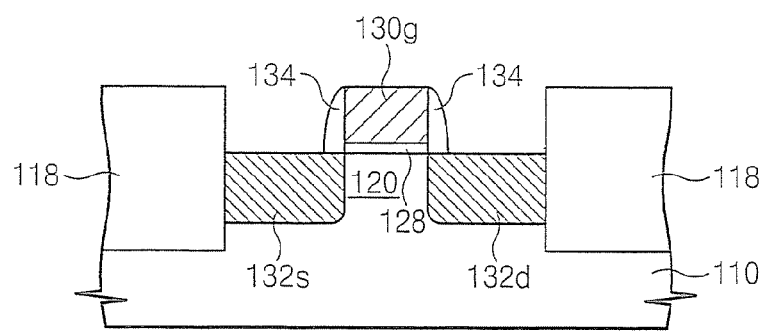
Figure 25C:
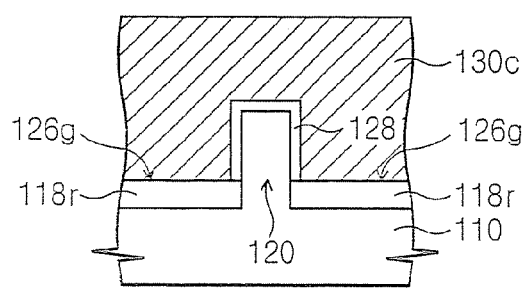

Referring to FIGS. 25A, 25B and 25C, the residual hard mask pattern 112a is removed to expose sidewalls of the gate electrode 130g. Impurities are implanted into the fin 120 using the gate electrode 130g as an ion implantation mask to respectively form source/drain regions 132s and 132d in the fin 120 at opposite sides of the gate electrode 130g. Sidewall spacers 134 are formed at both sidewalls of the gate electrode 130g. The sidewall spacers 134 cover sidewalls of the gate electrode 130g at the upper portions of the fin 120. The sidewalls of the gate electrode 130g may or may not be exposed at the upper portion of the device isolation layer 118. As a result, the sidewall spacer 134 may or may not be on the upper portion of the device isolation layer 118

The device isolation layer 118 is then etched using the sidewall spacers 134 and the gate electrode 130g as an etching mask to expose sidewalls of the fin 120. The device isolation layer 118 is aligned with the sidewall spacers 134 and is recessed to expose sidewalls of the fin 120. As such, the source/drain regions 132s and 132d are exposed at the exposed sidewalls of the fin 120. Accordingly, the exposed surface area of the source/drain regions 132s and 132d may be increased, thereby reducing contact resistance when source/drain contacts are formed in a subsequent step. In addition, the surface area of the source/drain regions 132s and 132d to be exposed may be controlled based on the recessed depth of the device isolation layer 118.

The source/drain regions 132s and 132d may be formed before or after forming the sidewall spacers 134. More specifically, before forming the sidewall spacers 134, the upper portion of the fin 120 may be exposed. As such, oblique ion implantation may not be suitable. In this case, if a projection range Rp is used, ions may be diffused under the gate 130g in a thermal annealing process to form a uniform ion profile. Therefore, it may be possible to prevent ions from being diffused under the gate 130g by controlling implantation depth, implanting ions by swiping implantation energy and by applying rapid thermal annealing.

After forming the sidewall spacers 134, the area between the ion implantation region and the gate 130g is covered by the sidewall spacers 134. As such, ions may be thermally diffused after ion implantation using a projection range Rp. In other words, ions may be prevented from being diffused under the gate 130g by the spacers 134. Alternatively, ion implantation may be performed using the same method as described above before forming the sidewall spacers 134.

Resultantly, as shown in FIGS. 18A, 18B and 18C, even though the fin width/thickness is scaled-down, the source/drain regions 132s and 132d are exposed at sidewalls of the fin 120. As a result, the exposed surface area of the source/drain regions 132s and 132d may be increased. Accordingly, when source/drain contacts are respectively formed on the source/drain regions 132s and 132d in a subsequent process, contact resistance can be reduced despite the decreased fin width/thickness. In other words, by electrically connecting the source/drain contacts with source/drain regions 132s and 132d exposed at both sidewalls and the upper portion of the fin 120, contact resistance may be reduced.

Also, although not shown, a silicide layer may be formed at the exposed upper portion and sidewalls of the fin 120, i.e. on the exposed source/drain regions 132s and 132d. The silicide layer may be further formed on an upper portion of the gate electrode 130g.

Figure 26A:
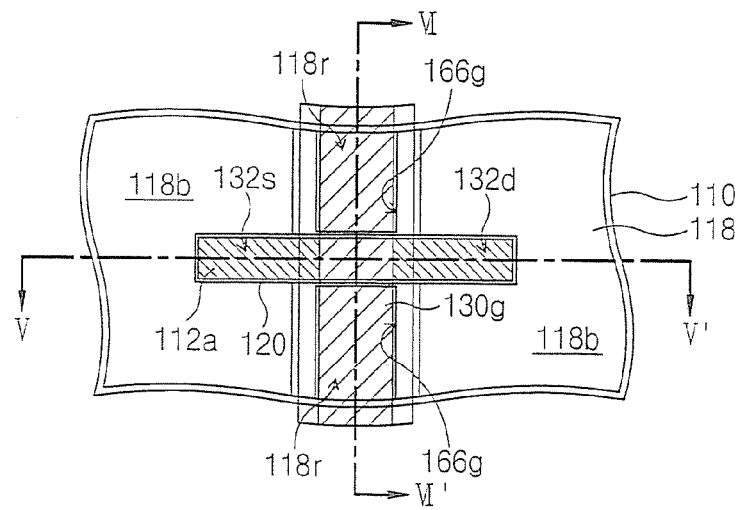
FIG. 26A is a plan view illustrating FinFETs according to further embodiments of the present invention.
Figure 26B:
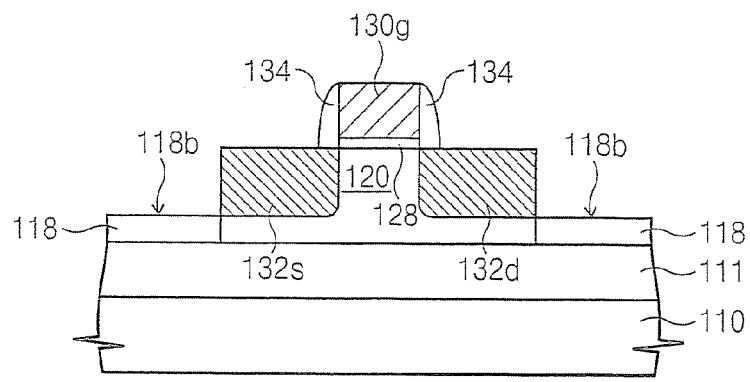
FIG. 26B is a cross-sectional view taken along line V-V of FIG. 26A.
Figure 26C:
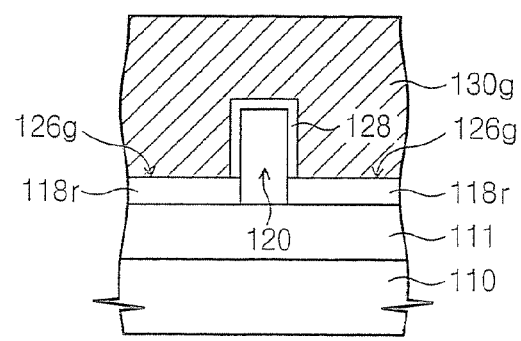
FIG. 26C is a cross-sectional view taken along line VI-VI' of FIG. 26A.

FIG. 26A is a plan view illustrating FinFETs according to further embodiments of the present invention. FIG. 26B is a cross-sectional view taken along line V-V' of FIG. 26A. FIG. 26C is a cross-sectional view taken along line VI-VI' of FIG. 26A.

Transistors according to some embodiments of the present invention may be formed on a bulk substrate as well as on a SOI (Silicon-On-Insulator, or Semiconductor-On-Insulator) substrate.

Referring now to FIGS. 26A, 26B and 26C, a SOI substrate comprises a base substrate 110, a buried insulation layer 111 formed on the base substrate 110 and a semiconductor layer on the buried insulation layer 111. The semiconductor layer may be formed of silicon, silicon-germanium, or graded silicon, where the lattice distance of silicon is increased. The semiconductor layer is patterned to form a vertically protruding fin-shaped active region 120 on the buried insulation layer 111. A device isolation layer 118 including a gate groove 126g covers sidewalls of the fin 120. The bottom of the gate groove 126g may be formed of a recessed device isolation layer 118r, or alternatively, the buried insulation layer 111 if the device isolation layer 118 is completely removed. A gate electrode 130g fills the gate groove 126g and covers an upper portion and both sidewalls of the fin 120. A gate insulation layer 128 is formed between the gate electrode 130g and the upper portion and both sidewalls of the fin 120. Sidewall spacers 134 are formed at both sidewalls of the gate electrode 130g. Source/drain regions 132s and 132d are respectively formed in the fin 120 at opposite sides of the gate electrode 130g. The device isolation layer 118 is aligned with the sidewall spacers 134, and may be removed until the buried insulation layer 111 is exposed. Accordingly, the sidewalls of the fin 120 are partially exposed, and surfaces of the source/drain regions 132s and 132d are exposed at the exposed sidewalls. Therefore, the exposed surface area of the source/drain regions 132s and 132d may be greater than the surface area of the upper surface of the fin 120, which is limited by the thickness of the fin 120 in a direction parallel to the gate electrode 130g. Although not shown, source/drain contacts may be respectively formed on the source/drain regions 132s and 132d. As such, the source/drain contacts may be in contact with the upper portion and the exposed sidewalls of the fin 120. In other words, even though the fin width/thickness is scaled-down, the source/drain contacts are connected to source/drain regions 132s and 132d at both the exposed sidewalls of the fin 120 and at the upper surface of the fin 120, thereby reducing resistance. Resistance may be further reduced by forming a silicide layer on the exposed surface of the source/drain regions 132s and 132d and the gate electrode 130g. The bottom of the gate groove 126g may be formed by the recessed device isolation layer 118r rather than peripheral regions, or alternatively, may be formed by the buried insulation layer 111. The source/drain regions 132s and 132d may be formed after recessing the device isolation layer 118, such as by using oblique ion implantation.

Figure 27A:
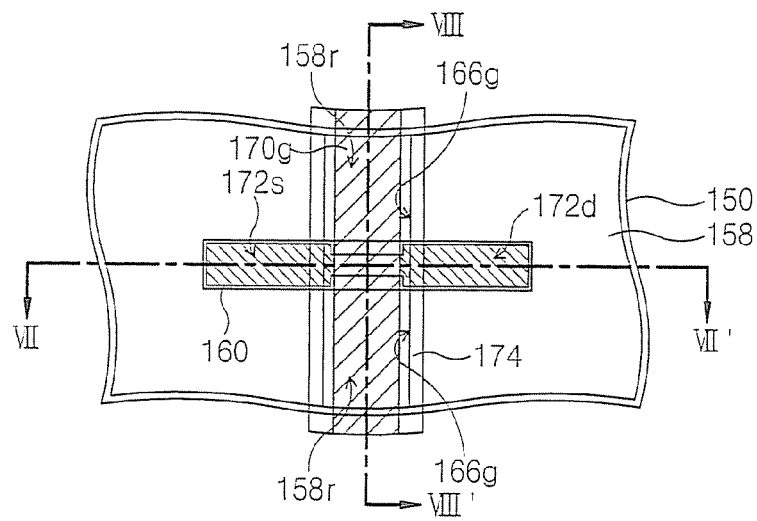
FIG. 27A is a plan view illustrating FinFETs according to other embodiments of the present invention.
Figure 27B:
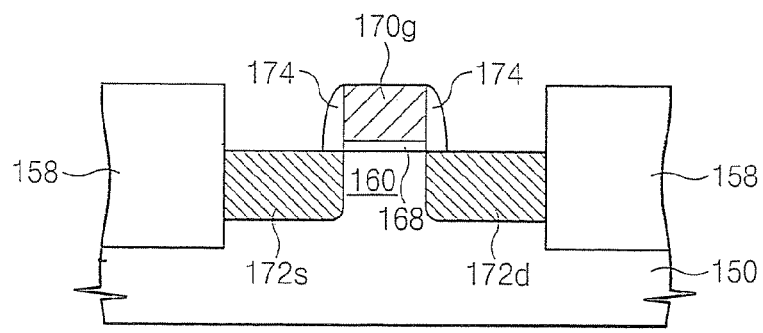
FIG. 27B is a cross-sectional view taken along line VII-VII' of FIG. 27A.
Figure 27C:
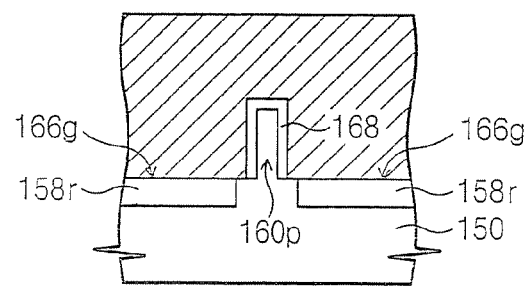
FIG. 27C is a cross-sectional view taken along line VIII-VIII' of FIG. 27A.

FIG. 27A is a plan view illustrating FinFETs according to other embodiments of the present invention. FIG. 27B is a cross-sectional view taken along line VII-VII' of FIG. 27A. FIG. 27C is a cross-sectional view taken along line VIII-VIII' of FIG. 27A.

Referring now to FIGS. 27A, 27B and 27C, a fin-shaped active region 160 is formed vertically protruding from a semiconductor substrate 150. A device isolation layer 158 including a gate grove 166g covers sidewalls of the fin 160. The bottom of the gate groove 166g is formed by a recessed device isolation layer 158r. A gate electrode 170g fills the gate groove 166g and covers the upper portion and both sidewalls of the fin 160. A gate insulation layer 168 is positioned between the gate electrode 170g and the upper portion and both sidewalls of the fin 160 to define a triple-gate structure. Sidewall spacers 174 are formed at both sidewalls of the gate electrode 170g. Source/drain regions 172s and 172d are respectively formed in the fin 160 at both sidewalls of the gate electrode 170g. The fin 160 may include a first portion covered by and/or under the gate electrode 170g, and a second portion where the source/drain regions 172s and 172d are formed. The portion covered by the gate electrode 170g may be self-aligned with the gate electrode 170g, and may have a narrower width than the portion where the source/drain regions 172s and 172d are formed. A channel region is formed at the portion of the fin 160 covered by the gate electrode 170g. Accordingly, the channel region is self-aligned with the gate electrode 170g. The channel region is formed at the upper portion and both sidewalls of the fin 160.

As shown in FIGS. 27A, 27B and 27C, the portion of the fin 160 including the source/drain regions 172s and 172d may have a greater width/thickness than the portion of the fin 160 covered by the gate electrode 170g in a direction parallel to the gate electrode 170g. In other words, even though the portion of the fin 160 including the channel region is scaled-down, the portion of the fin 160 where the source/drain regions 172s and 172d are formed may have a greater width/thickness. Accordingly, contact resistance at the source/drain regions 172s and 172d may be reduced. Resistance may be further reduced by forming a silicide layer on the exposed surfaces of the gate electrode 170g and the source/drain regions 172s and 172d.

FIGS. 28A to 32A are plan views illustrating exemplary operations for fabricating FinFETs according to other embodiments of the present invention. FIGS. 28B to 32B are cross-sectional views taken along line VII-VII' of FIGS. 28A to 32A. FIGS. 28C to 32C are cross-sectional views taken along line VIII-VIII' of FIGS. 28A to 32A.

Figure 28A:
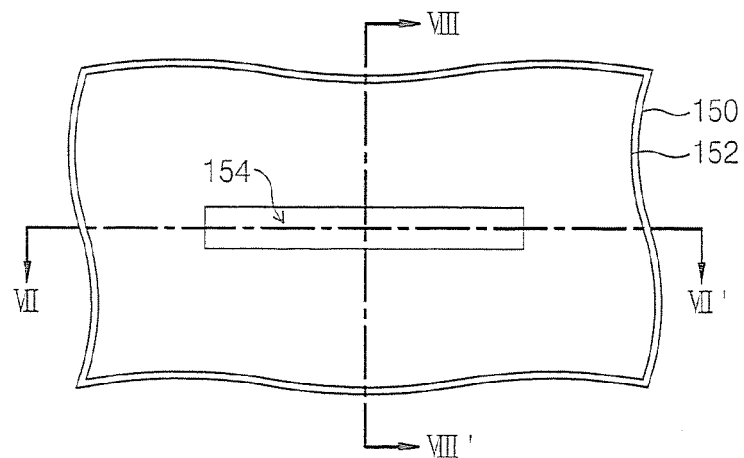
Figure 28B:
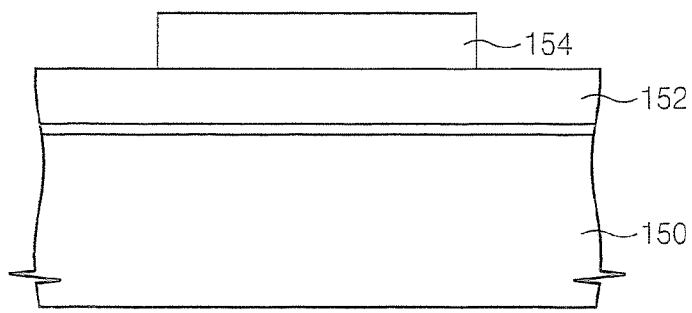
Figure 28C:
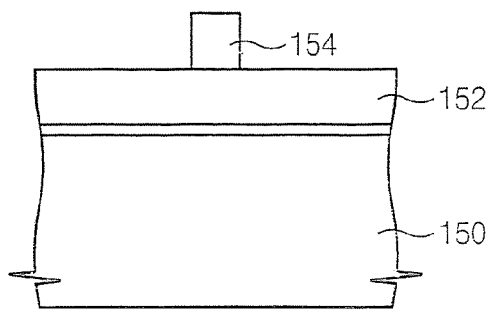

Referring now to FIGS. 28A, 28B and 28C, a hard mask layer 152 is formed on a semiconductor substrate 150. A photoresist pattern 154 for forming a fin is formed on the hard mask layer 152.

Figure 29A:
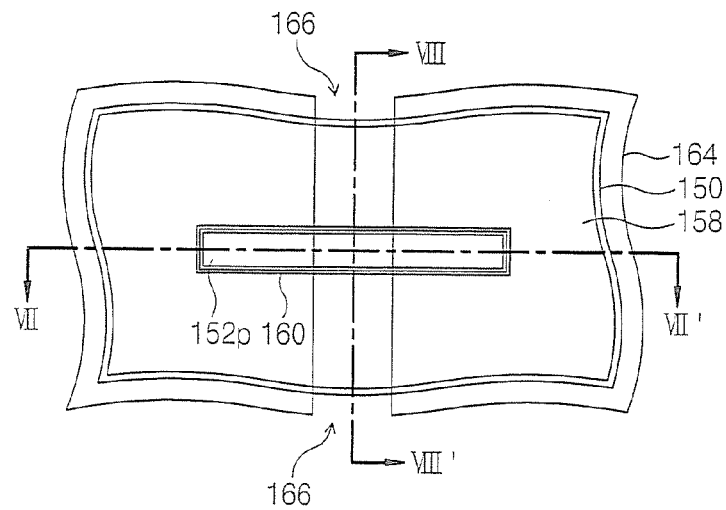
Figure 29B:
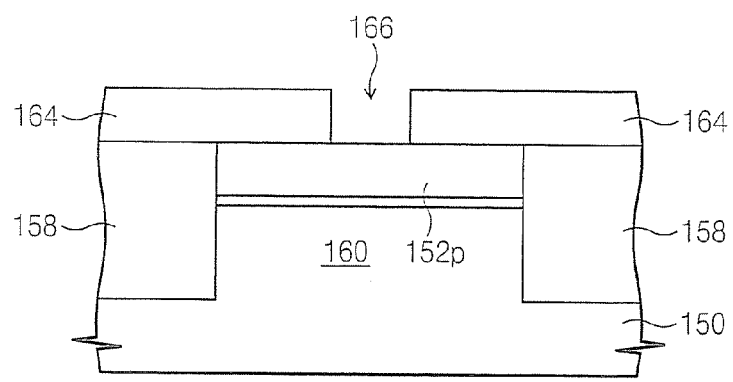
Figure 29C:
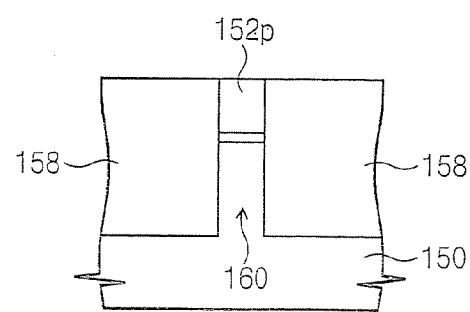

Referring to FIGS. 29A, 29B and 29C, the hard mask layer 152 and the semiconductor substrate 150 are patterned using the photoresist pattern 154 as an etching mask to define a vertically protruding fin-shaped active region 160 and a device isolation region. A hard mask pattern 152p is formed over the fin 160. The photoresist pattern 154 is removed. Alternatively, the photoresist pattern 154 may be removed after forming the hard mask pattern 152p, and the hard mask pattern 152p may be used as an etching mask. An insulation layer is formed on an entire surface of the semiconductor substrate 150, filling the device isolation region. The insulation layer is polished by CMP to expose the hard mask pattern 152p and to form a device isolation layer 158 in the device isolation region. A photoresist pattern 164 including a gate opening 166 is formed on a substrate 150 where the device isolation layer 158 is formed. The gate opening 166 crosses over the fin 160.

A gate electrode covering the upper portion and both sidewalls of the fin 160 is then formed using a damascene process, as described below.

Figure 30A:
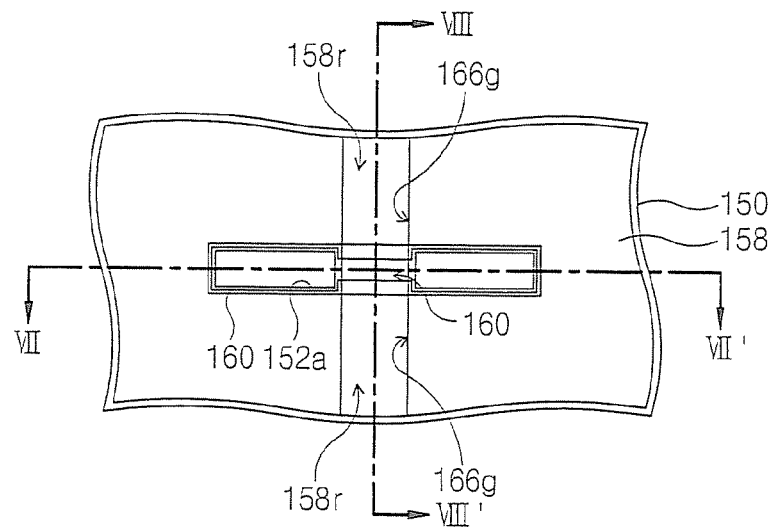
Figure 30B:
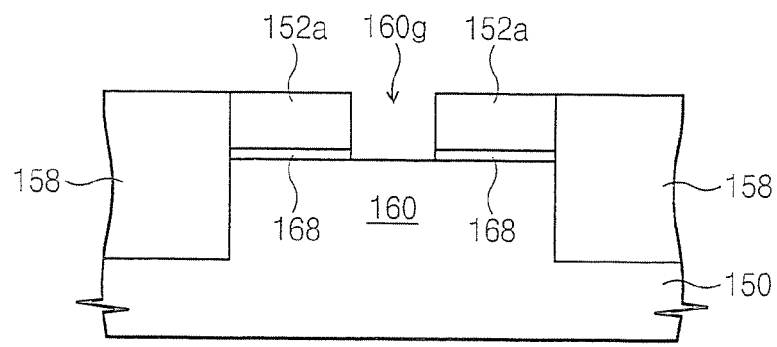
Figure 30C:
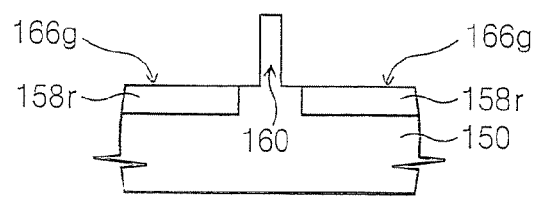

Referring to FIGS. 30A, 30B and 30C, the hard mask pattern 152p and the device isolation layer 158 are etched using the photoresist pattern 164 as an etching mask to form a gate groove 166g. The gate groove 166g exposes both sidewalls of the fin 160. As shown in FIG. 30B, a portion of the hard mask pattern 152p exposed by the gate groove 166g is removed to expose an upper portion of the fin 160, leaving a residual hard mask pattern 152a at both sides of the gate groove 166g. The photoresist pattern 164 is removed.

The thickness of the fin 160 is then reduced by recessing sidewalls of the fin 160 which are exposed by the gate groove 166g. The fin may be recessed using an isotropic etching process, or alternatively, by removing an oxide layer formed on the fin 160 by a thermal oxidation process. A channel region may be formed in the fin 160 by implanting impurities into the exposed sidewalls of the fin 160.

Figure 31A:
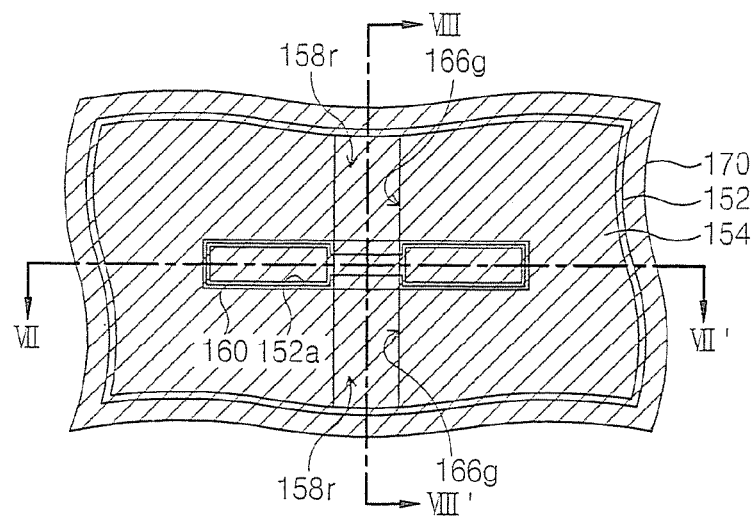
Figure 31B:
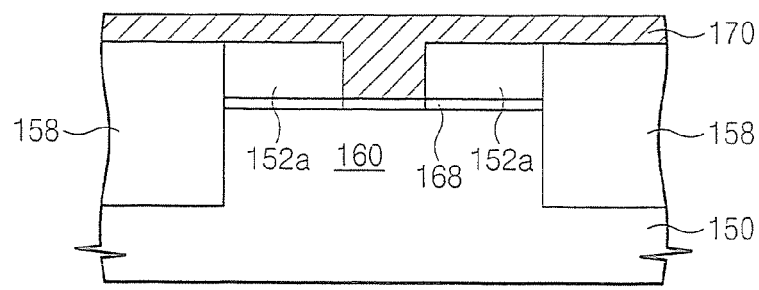
Figure 31C:
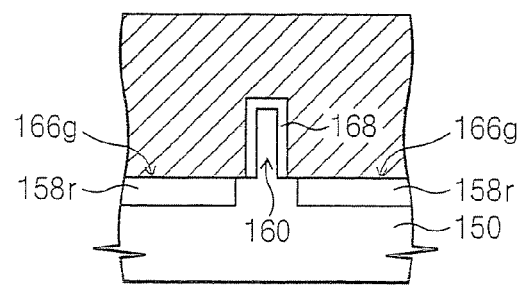

Referring to FIGS. 31A, 31B and 31C, a gate insulation layer 168 is formed on the upper surface and sidewalls of the fin 160 exposed by the gate groove 166g. A conductive layer 170 is formed on an entire surface of a substrate 150 to fill the gate groove 166g where the gate insulation layer 168 is formed. The conductive layer 170 may be formed of a variety of materials, depending on the conductivity desired for a particular application. For example, the conductive layer 170 may be formed of a polysilicon layer, a polycide layer, or a metal layer.

Figure 32A:
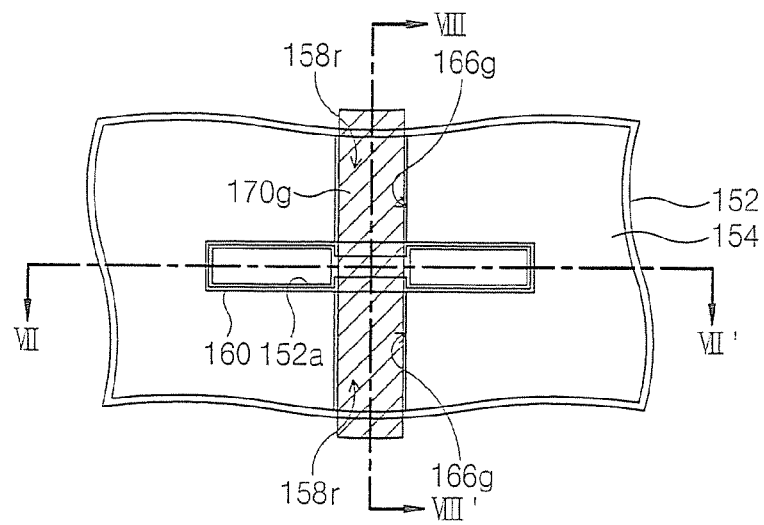
Figure 32B:
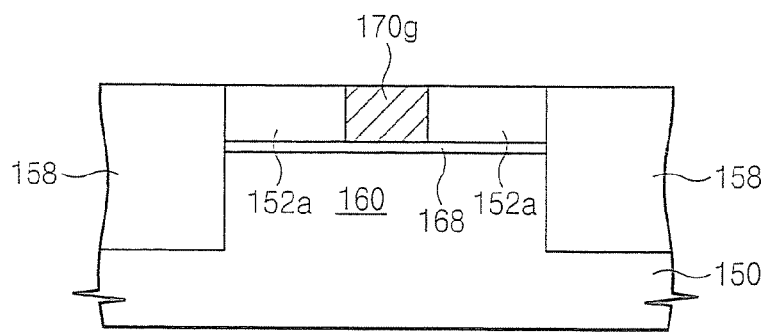
Figure 32C:
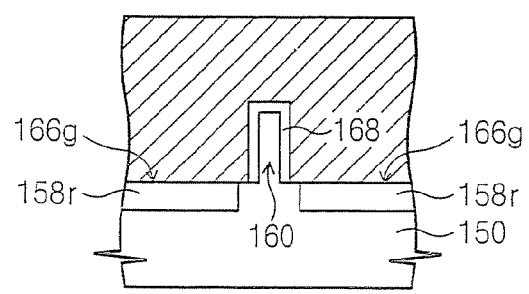

Referring to FIGS. 32A, 32B and 32C, the conductive layer 170 is recessed to form a gate electrode 170g in the gate groove 166g. The conductive layer 170 may be recessed by an etch-back process and/or by CMP.

The residual hard mask pattern 152a at both sides of the gate electrode 170g is removed, and sidewall spacers 174 and source/drain regions 172s and 172d are formed. As a result, as shown in FIGS. 27A, 27B and 27C, a FinFET may be formed.

More particularly, an upper surface of the fin 160, as well as sidewalls thereof, are covered by the gate electrode 170g to form a triple-gate transistor. Impurities are implanted into the fin 160 using the gate electrode 170g as an ion implantation mask to respectively form source/drain regions 172s and 172d in the fin at opposite sides of the gate electrode 170g. Sidewall spacers 174 are formed at both sidewalls of the gate electrode 170g. The sidewall spacers 174 cover sidewalls of the gate electrode 170g at an upper portion of the fin 160. Where the gate electrode 170g is formed on the upper portion of the device isolation layer 158, the sidewall spacers 174 are formed at sidewalls of the gate electrode 170g. However, the gate electrode 170g may not be formed on the upper portion of the device isolation layer 158, and as such, the sidewall spacers 174 may not be formed on the device isolation layer 158. As a result, as shown in FIGS. 27A, 27B and 27C, even though the portion of the fin 160 where source/drain regions 172s and 172d are formed have a greater width/thickness, the portion of the fin 160 including the channel region and self-aligned with the gate electrode 170 may be scaled-down. Accordingly, the source/drain regions 172s and 172d may have a lower contact resistance due to the greater area, despite the reduction in width/thickness of the fin 160 at the channel region.

The source/drain regions 172s and 172d may be formed before or after forming the sidewall spacers 174. More specifically, before forming the sidewall spacers 174, an upper surface of the fin 160 may be exposed, such that oblique ion implantation may not be suitable. In this case, if a projection range Rp is used, ions may be diffused under the gate 170g in a thermal annealing process to form a uniform ion profile. Therefore, it may be possible to prevent ions from being diffused under the gate 170g by controlling implantation depth, implanting ions by swiping ion energy, and applying rapid thermal annealing.

After forming the sidewall spacers 174, the area between the ion implantation region and the gate 170g is covered by the sidewall spacers 174. Accordingly, after implanting ions using the projection range Rp, ions may be thermally diffused. In other words, the spacers 174 may prevent ions from being diffused under the gate 170g. However, the same ion implantation method used before forming the sidewall spacers 174 may also be used.

Also, although not shown, a silicide layer may be formed on the source/drain regions 172s and 172d, that is, on the exposed upper portion and sidewalls of the fin 160. In addition, the silicide layer may be formed on the upper portion of the gate electrode 170g.

Figure 33A:
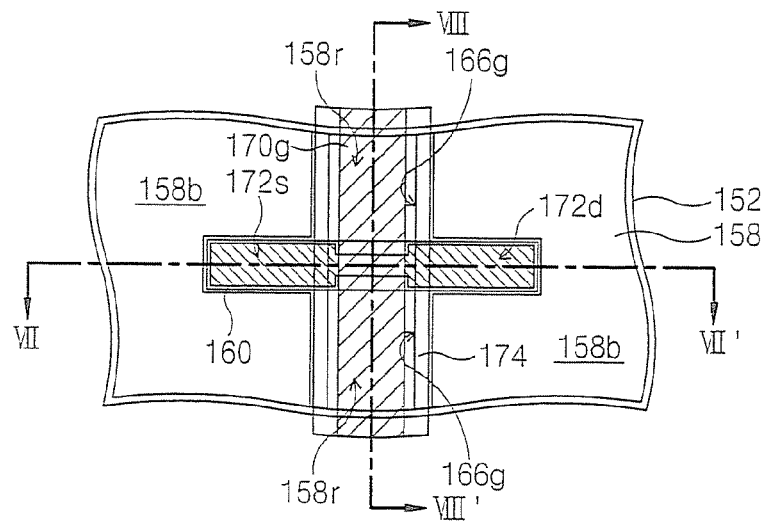
FIG. 33A is a plan view illustrating FinFETs according to further embodiments of the present invention.
Figure 33B:
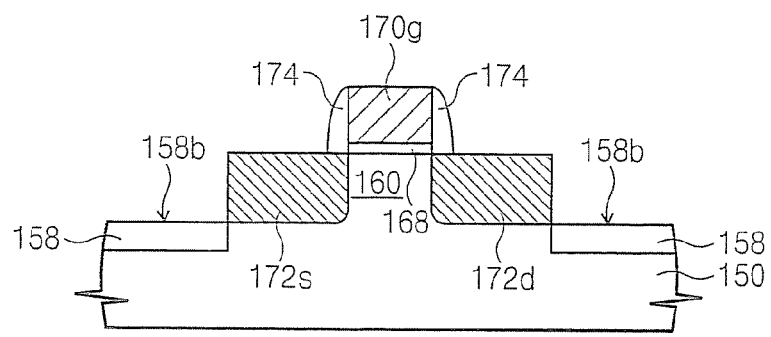
FIG. 33B is a cross-sectional view taken along line VII-VII' of FIG. 33A.
Figure 33C:
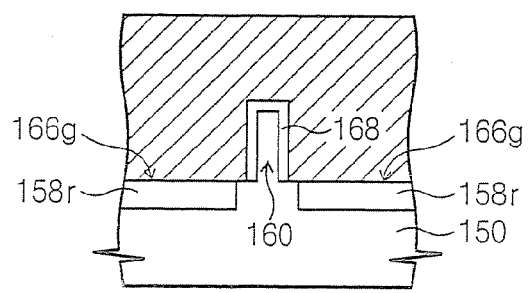
FIG. 33C is a cross-sectional view taken along line VIII-VIII' of FIG. 33A.

FIGS. 33A, 33B and 33C illustrate FinFETs according to further embodiments of the present invention.

Referring now to FIGS. 33A, 33B and 33C, the device isolation layer 158 is etched using the sidewall spacers 174 and the gate electrode 170g as an etching mask to expose sidewalls of the fin 160. The device isolation layer 158 is aligned with the sidewall spacers 174, and is recessed to expose sidewalls of the fin 160. The source/drain regions 172s and 172d are thereby exposed at the exposed sidewalls of the fin 160. Accordingly, the exposed surface area of the source/drain regions 172s and 172d may be increased, thereby decreasing contact resistance. In addition, the surface area of the source/drain regions 172s and 172d to be exposed may be controlled based on a recessed depth of the device isolation layer 158. The source/drain regions 172s and 172d may be formed after recessing the device isolation layer 158, such as by ion implantation.

Figure 34A:
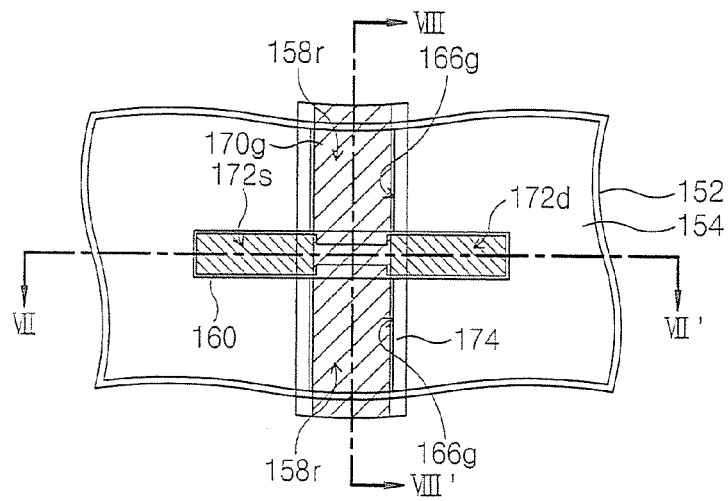
FIG. 34A is a plan view illustrating FinFETs according to still further embodiments of the present invention.
Figure 34B:
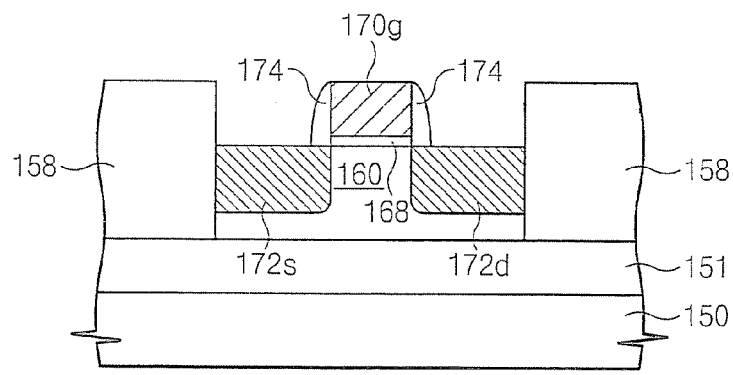
FIG. 34B is a cross-sectional view taken along line VII-VII' of FIG. 34A.
Figure 34C:
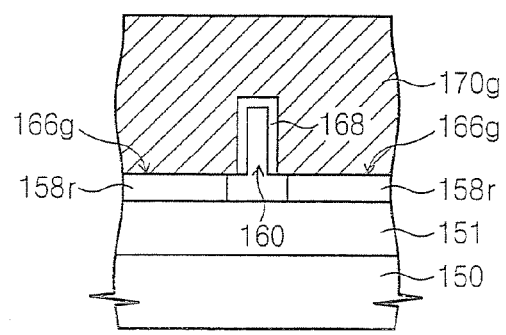
FIG. 34C is a cross-sectional view taken along line VIII-VIII' of FIG. 34A.

FIG. 34C is a plan view illustrating FinFETs formed on an SOI substrate according to still further embodiments of the present invention. FIG. 34B is a cross-sectional view taken along line VII-VII' of FIG. 34A. FIG. 34C is a cross-sectional view taken along line VIII-VIII' of FIG. 34A.

Referring to FIGS. 34A, 34B and 34C, a SOI substrate comprises a base substrate 150, a buried insulation layer 151 formed on the base substrate 150 and a semiconductor layer on the buried insulation layer 151. The semiconductor layer may be formed of silicon, silicon-germanium or graded silicon, where the lattice distance is increased. The semiconductor layer is patterned to form a vertically protruding fin-shaped active region 160 on the buried insulation layer 151. A device isolation layer 158 including a gate groove 166g covers sidewalls of the fin 160. The bottom of the gate groove 166g may be formed of a recessed device isolation layer 158r, or alternatively, the buried insulation layer 151. A gate electrode 170g fills the gate groove 166g and covers the upper portion and both sidewalls of the fin 160. A gate insulation layer 168 is formed between the gate electrode 170g and the upper portion and both sidewalls of the fin 160. Sidewall spacers 174 are formed at both sidewalls of the gate electrode 170g. Source/drain regions 172s and 172d are respectively formed in the fin 160 at opposite sides of the gate electrode 170g. The fin 160 may be include a first portion covered by and/or under the gate electrode 170g, and a second portion where the source/drain regions 172s and 172d are formed. The portion covered by the gate electrode 170g may be self-aligned with the gate electrode 170g, and may have a narrower width/thickness in comparison with the portion of the fin 160 where the source/drain regions 172s and 172d are formed. A channel region is formed on the gate electrode 170g. Accordingly, the channel region is self-aligned with the gate electrode 170g. The width/thickness of the portion of the fin 160 including the source/drain regions 172s and 172d may be wider than the width/thickness of the portion of the fin 160 covered by the gate electrode 170g in a direction parallel to the gate electrode 170g. In other words, even if the portion of the fin 160 including the channel region is scaled-down and/or otherwise recessed, the portion of the fin 160 where the source/drain regions 172s and 172d are formed may have a greater width/thickness. As a result, contact resistance at the source/drain regions 172s and 172d may be reduced due to the greater contact surface area. In addition, resistance may be further reduced by forming a silicide layer on the source/drain regions 172s and 172d and the gate electrode 170g. The bottom of the gate groove 166g may be formed by a recessed device isolation layer 158r rather than by peripheral regions, or alternatively, may be formed by the buried insulation layer 151. As described above, the device isolation layer 158 is aligned with the sidewall spacers 174 and is recessed to form the recessed device isolation layer 158r. Alternatively, the device isolation layer 118 may be aligned with the sidewall spacer 134 and completely removed to expose the buried insulation layer 111 at the bottom of the gate groove 166g.

Figure 35A:
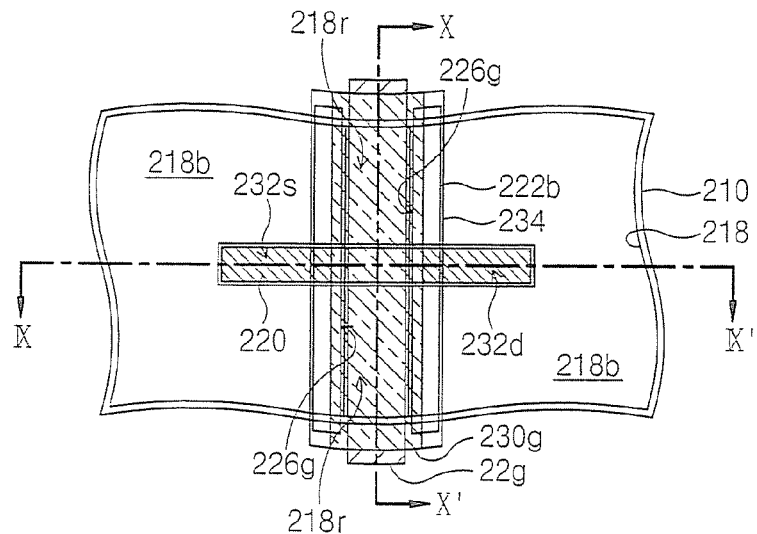
FIG. 35A is a plan view illustrating FinFETs according to still other embodiments of the present invention.
Figure 35B:
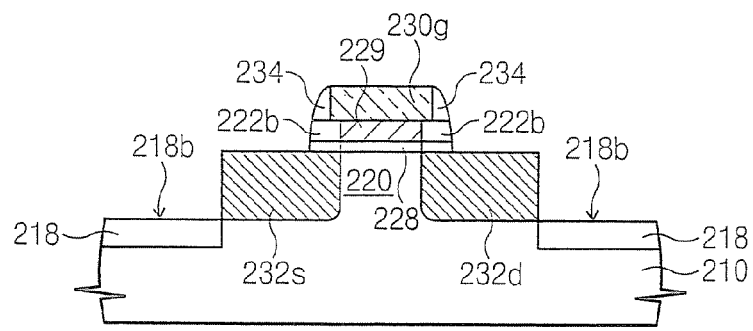
FIG. 35B is a cross-sectional view taken along line IX-IX' of FIG. 35A.
Figure 35C:
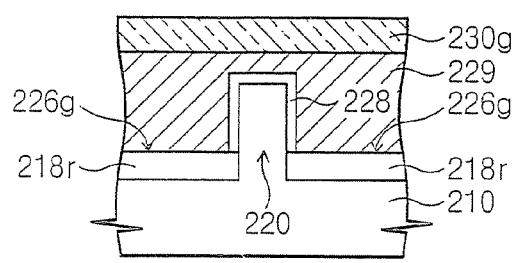
FIG. 35C is a cross-sectional view taken along line X-X' of FIG. 35A.

FIG. 35A is a plan view illustrating FinFETs according to still other embodiments of the present invention. FIG. 35B is a cross-sectional view taken along line IX-IX' of FIG. 35A. FIG. 35C is a cross-sectional view taken along line X-X' of FIG. 35A.

Referring now to FIGS. 35A, 35B and 35C, a fin-shaped active region 220 is formed vertically protruding from a semiconductor substrate 210. A device isolation layer 218 including a gate groove 226g covers sidewalls of the fin 220. A gate electrode fills the gate groove 226g and covers an upper portion and both sidewalls of the fin 220. The bottom of the gate groove 226g is formed by a recessed device isolation layer 218r. The gate electrode includes a lower gate pattern 229 and an upper gate pattern 230g. The lower gate pattern 229 is fills the gate groove 226g to cover the sidewalls and the upper portion of the fin 220. The upper gate pattern 230g is formed on the lower gate pattern 229. A gate insulation layer 228 is formed between lower gate pattern 229 and the upper portion and both sidewalls of the fin 220 to define a triple-gate structure. As such, a channel region may be formed at both sidewalls and the upper portion of the fin 220. Sidewall spacers are formed at both sidewalls of the gate electrode. Source/drain regions 232s and 232d are respectively formed in the fin 220 at opposite sides of the gate electrode. The sidewall spacers include lower sidewall spacers 222b formed at sidewalls of the lower gate pattern 229 and upper sidewall spacers 234 formed at sidewalls of the upper gate pattern 230g.

The device isolation layer 118 is aligned with the upper and lower sidewall spacers 222b and 234 and is recessed to partially expose the sidewalls of the fin 220. As such, surfaces of the source/drain regions 232s and 232d are exposed at the exposed sidewalls of the fin 220. Therefore, the exposed surface area of the source/drain regions 232s and 232d (including both sidewalls and the upper surface of the fin 220) may be greater than the surface area of the upper surface of the fin 220 alone, which is limited by the width/thickness of the fin 220 in a direction parallel to the gate electrode. Although not shown, source/drain contacts may be respectively formed on the source/drain regions 232s and 232d. As such, the source/drain contacts may be in contact with both the upper portion and the exposed sidewalls of the fin 220 at the source/drain regions 232s and 232d. In other words, even though the fin 220 may be scaled-down, the exposed source/drain regions 232s and 232d provide a greater contact area for the source/drain contacts, thereby reducing resistance. In addition, resistance may be further reduced by forming a silicide layer on the source/drain regions 232s and 232d and the gate electrode.

FIGS. 36A to 39A are plan views illustrating exemplary operations for fabricating FinFETs according to still other embodiments of the present invention. FIGS. 36B to 39B are cross-sectional views taken along line XI-XI' of FIGS. 36A to 39A. FIGS. 36C to 39C are cross-sectional views taken along line XI-XI' of FIGS. 36A to 39A.

Figure 36A:
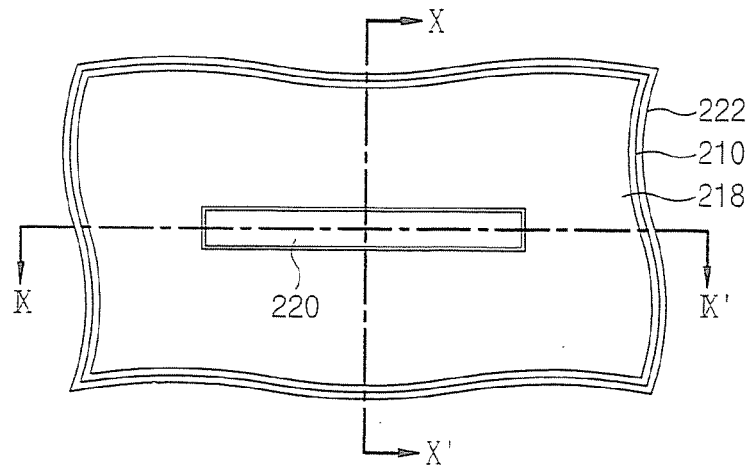
Figure 36B:
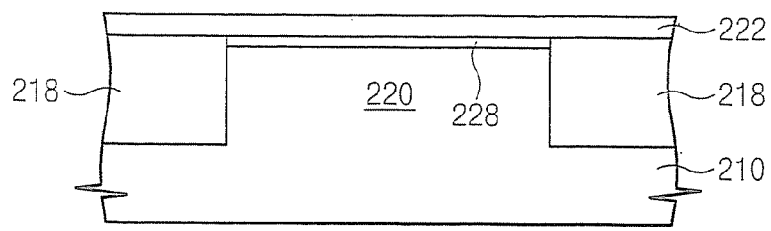
Figure 36C:
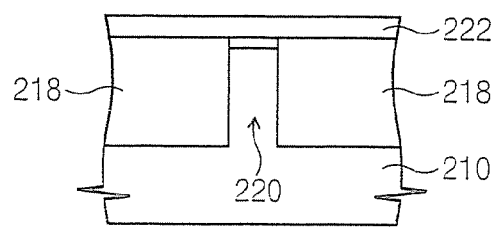

Referring now to FIGS. 36A, 36B and 36C, a hard mask layer is formed on a semiconductor substrate 210. The hard mask layer and the semiconductor substrate are patterned to define a vertically protruding fin-shaped active region 220 and a device isolation region. An insulation layer is formed on an entire surface of the semiconductor substrate 210, filling the device isolation region. The insulation layer is polished by CMP to form a device isolation layer 218 in the device isolation region. An insulation layer 222 used as a gate mask is formed on an entire surface of a substrate including the device isolation layer 218. The insulation layer 222 can prevent the semiconductor substrate 220 and the device isolation layer 218 from being etched. In addition, the insulation layer 222 may be formed of silicon nitride. Before forming the insulation layer 222, a buffer oxide layer 228 may be further formed on a surface of the fin 220.

Figure 37A:
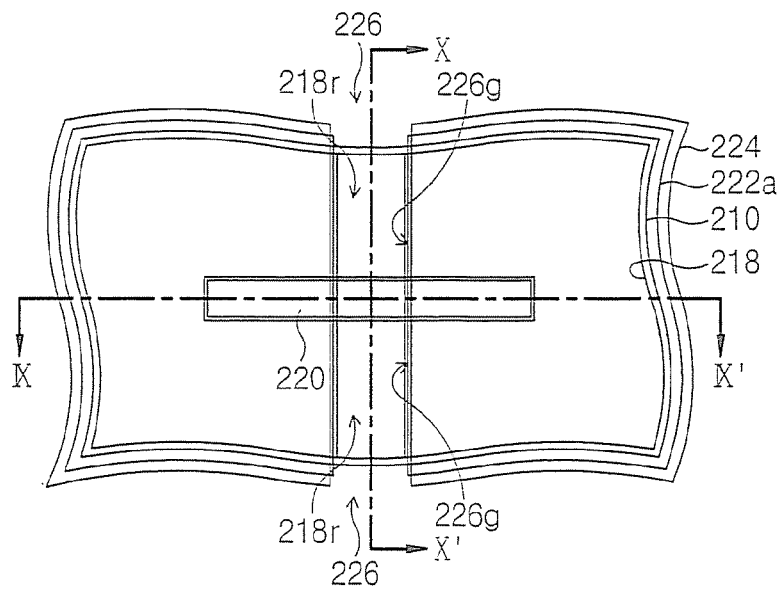
Figure 37B:
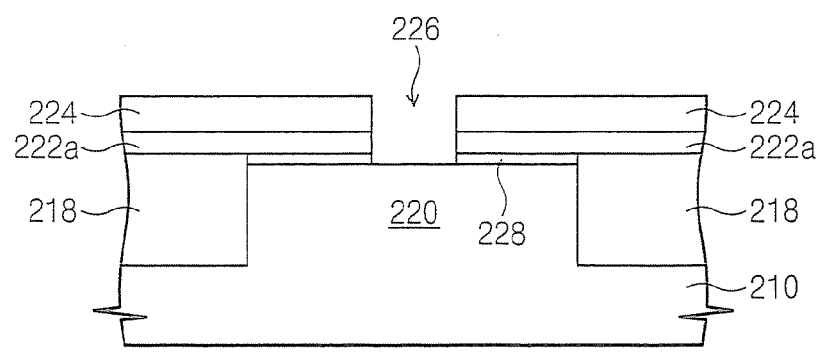
Figure 37C:
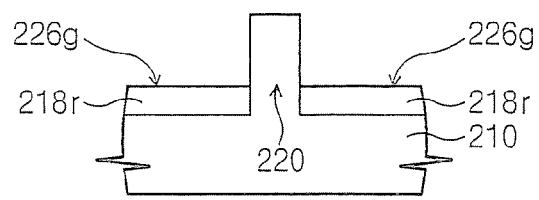

Referring to FIGS. 37A, 37B and 37C, a photoresist pattern 224 including a gate opening 226 is formed on the insulation layer 222. The gate opening 226 crosses over the fin 220. The insulation layer 222 and the device isolation layer 218 are etched using the photoresist pattern 224 as an etching mask to form an insulation pattern 222a and a gate groove 226g.

Figure 38A:
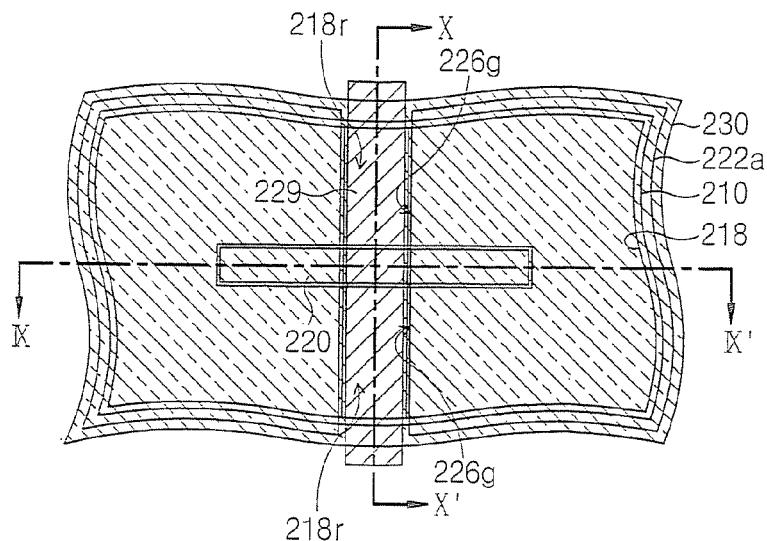
Figure 38B:
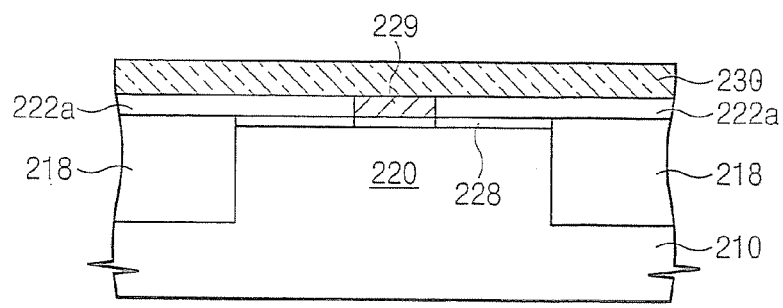
Figure 38C:
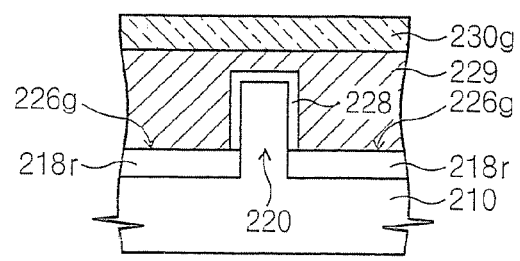

Referring to FIGS. 38A, 38B and 38C, after forming the gate groove 226g, the photoresist pattern 224 is removed to expose an insulation pattern 222a. Alternatively, the photoresist pattern 224 may be used only to pattern the insulation layer 222a, and may then be removed, and the insulation pattern 222a may be used as an etching mask to etch the device isolation layer 218 and form the gate groove 226g. The gate groove 226g is formed such that a recessed device isolation layer 218r remains at the bottom of the gate groove 226g. A channel region may then be formed by implanting impurities into the upper surface and sidewalls of the fin 220 exposed by the gate groove 226g. Alternatively, the channel region may be formed by implanting impurities after forming the fin 220.

A gate insulation layer 228 is then formed on the upper surface and sidewalls of the fin 220 exposed by the gate groove 226g. A first conductive layer is formed on an entire surface of a substrate, filling the gate groove 226g where the gate insulation layer 228 is formed. The first conductive layer is etched-back or recessed by CMP to form a lower gate pattern 229 covering the upper portion and both sidewalls of the fin 220 in the gate groove 226g. A second conductive layer 230 is formed on an entire surface of a substrate including the lower gate pattern 229. The second conductive layer 230 may have excellent conductivity and may be formed of metal and/or metal silicide. The second conductive layer 230 may also be formed of polysilicon, and may be silicided in a subsequent process.

Figure 39A:
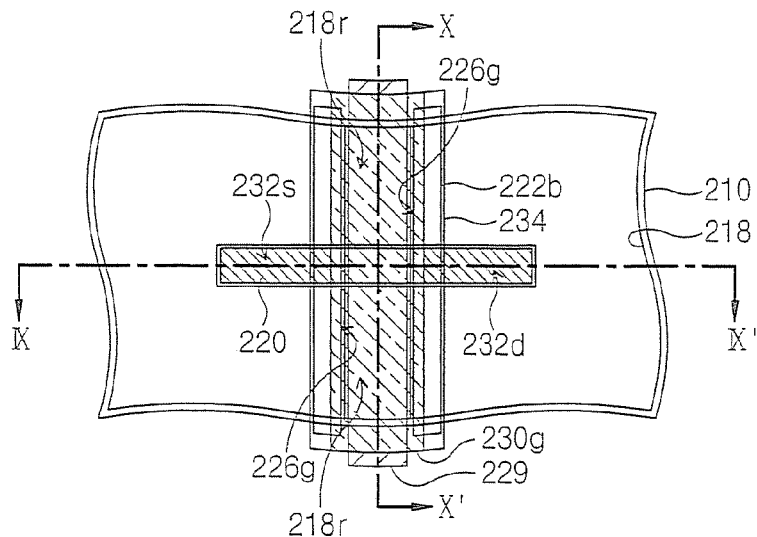
Figure 39B:
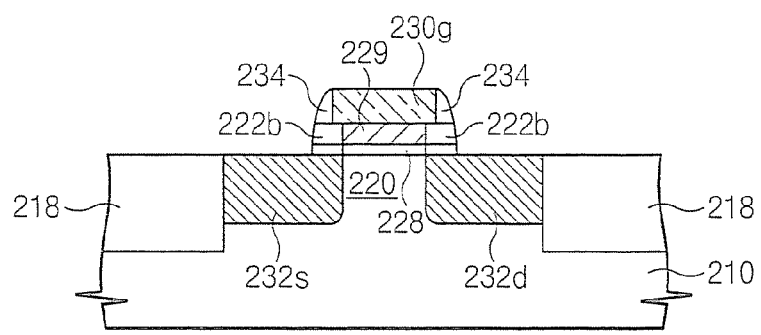
Figure 39C:
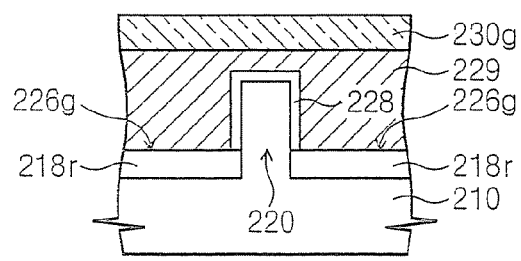

Referring to FIGS. 39A, 39B and 39C, the second conductive layer 230 is patterned to form an upper gate pattern 230g on the lower gate pattern 229. As such, the upper gate pattern 230g crosses over the fin 220. Impurities are implanted into the fin 220 using the upper gate electrode 230g as an ion implantation mask to respectively form source/drain regions 232s and 232d at opposite sides of the upper gate electrode 230g. The impurities may be transmitted through the insulation pattern 222a to be implanted into the fin 220 and may be diffused into a portion of the fin 220 adjacent to the lower gate pattern 229. Upper sidewall spacers 234 are formed at both sidewalls of the upper gate electrode 230g. The insulation pattern 222a is patterned using the upper sidewall spacers 234 as an etching mask to form lower sidewall spacers 222b under the upper sidewall spacers 234. The lower sidewall spacers 222b are formed at sidewalls of the lower gate pattern 229.

The source/drain regions 232s and 232d may be formed before or after forming the sidewall spacers 234. More specifically, before forming the sidewall spacers 234, the upper portion of the fin 220 is exposed, such that oblique ion implantation may not be suitable. As such, ions may be thermally diffused after implanting ions using a projection range Rp. In other words, the spacers 234 may prevent ions from being diffused under the gate. Alternatively, ion implantation may be performed using the same method as described above before forming the sidewall spacers 234.

The device isolation layer 218 is then etched using the upper sidewall spacer 234 and the upper gate electrode 230g as an etching mask to expose sidewalls of the fin 220. The device isolation layer 218 is aligned with the spacers 234 and is recessed to expose the sidewalls of the fin 220. As such, the source/drain regions 232s and 232d are exposed at the exposed sidewalls of the fin 220. Accordingly, the exposed surface area of the source/drain regions 232s and 232d may be increased, thereby providing reduced contact resistance when source/drain contacts are formed in a subsequent step. The source/drain regions 232s and 232d may also be formed after recessing the device isolation layer 218, such as by using oblique ion implantation. The exposed surface area of the source/drain regions 232s and 232d may be controlled based on the recessed depth of the device isolation layer 218.

Resultantly, as shown in FIGS. 35A, 35B and 35C, even though the fin 220 is scaled-down, the sidewalls of the source/drain regions 232s and 232d are exposed, thereby increasing the exposed surface area of the source/drain regions 232s and 232d. Accordingly, when source/drain contacts are formed on the source/drain regions 232s and 232d in a subsequent process, contact resistance can be reduced despite the reduced width/thickness of the fin 220 by electrically connecting the source/drain contacts at both the upper surfaces and sidewalls of the fin 220.

Also, although not shown, a silicide layer may be formed on the source/drain regions 232s and 232d, that is, on the exposed upper portion and sidewalls of the fin 220. In addition, the silicide layer may also be formed on an upper portion of the gate electrode.

Figure 40A:
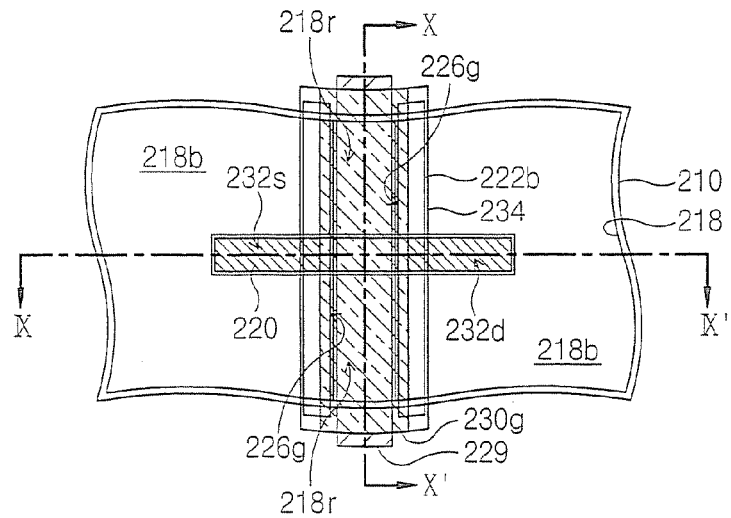
FIG. 40A is a plan view illustrating further embodiments of the present invention.
Figure 40B:
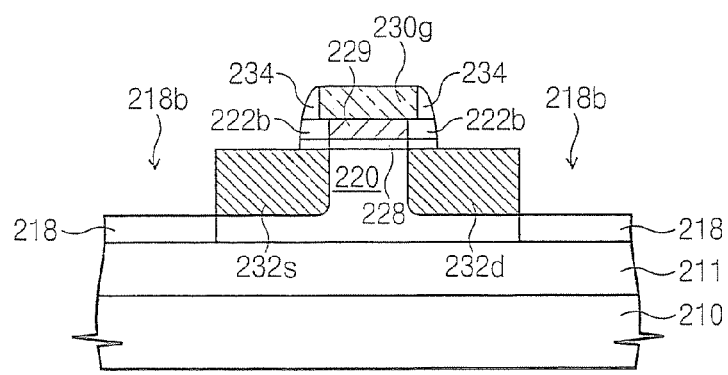
FIG. 40B is a cross-sectional view taken along line IX-IX' of FIG. 40A.
Figure 40C:
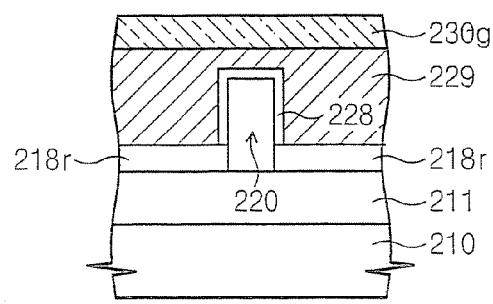
FIG. 40C is a cross-sectional view taken along line X-X' of FIG. 40A.

FIG. 40A is a plan view illustrating FinFETs formed on a SOI substrate according to further embodiments of the present invention. FIG. 40B is a cross-sectional view taken along line IX-IX' of FIG. 40A. FIG. 40C is a cross-sectional view taken along line X-X' of FIG. 40A.

Referring to FIGS. 40A, 40B and 40C, a SOI substrate comprises a base substrate 210, a buried insulation layer 211 formed on the base substrate 210 and a semiconductor layer on the buried insulation layer 211. The semiconductor layer may be formed of silicon, silicon-germanium or graded silicon, where the lattice distance of silicon is increased.

A vertically protruding fin-shaped active region 220 is formed on the buried insulation layer 211. A device isolation layer 218 including a gate groove 226g covers sidewalls of the fin 220. A gate electrode fills the gate groove 226g and covers an upper portion and sidewalls of the fin 220. The bottom of the gate groove 226g may be formed of a recessed device isolation layer 218r or the buried insulation layer 211. The gate electrode comprises a lower gate pattern 229 and an upper gate pattern 230g. The lower gate pattern 229 fills the gate groove 226g to cover sidewalls and the upper portion of the fin 220. The upper gate pattern 230g is formed on the lower gate pattern 229. A gate insulation layer 228 is formed between the gate electrode and the upper portion and sidewalls of the fin 220 to define a triple-gate structure. Accordingly, a channel region may be formed at both sidewalls and at the upper portion of the fin 220. Sidewall spacers are formed at both sidewalls of the gate electrode. Source/drain regions 232s and 232d are respectively formed in the fin 220 at opposite sides of the gate electrode. The sidewall spacers include lower sidewall spacers 222b formed on sidewalls of the lower gate pattern 229, and upper sidewall spacers 234 formed at sidewalls of the upper gate pattern 230g. The device isolation layer 218 is aligned with the lower and upper sidewall spacers 222b and 234, and recessed to form a recessed device isolation layer 218r. Therefore, the sidewalls of the fin 220 are partially exposed, and thus the source/drain regions 232s and 232d are exposed at the exposed sidewalls of the fin 220. The exposed surface area of the source/drain regions 232s and 232d may be greater than surface area of the upper surface of the fin 220 alone, which is limited by the width/thickness of the fin 220 in a direction parallel to gate electrode. Although not shown, source/drain contacts may be respectively formed on the source/drain regions 232s and 232d. The source/drain contacts may be in contact with the upper portion and the exposed sidewalls of the fin 220 where the source/drain regions 232s and 232d are formed. In other words, even as fin width/thickness is scaled-down, the exposed source/drain regions 232s and 232d provide a greater contact area for the source/drain contacts, thereby reducing resistance. In addition, resistance may be further reduced by forming a silicide layer on the source/drain regions 232s and 232d and the gate electrode. The bottom of the gate groove 226g may be formed by the recessed device isolation layer 218r rather than by peripheral regions, or alternatively, may be formed by the buried insulation layer 211.

Figure 41A:
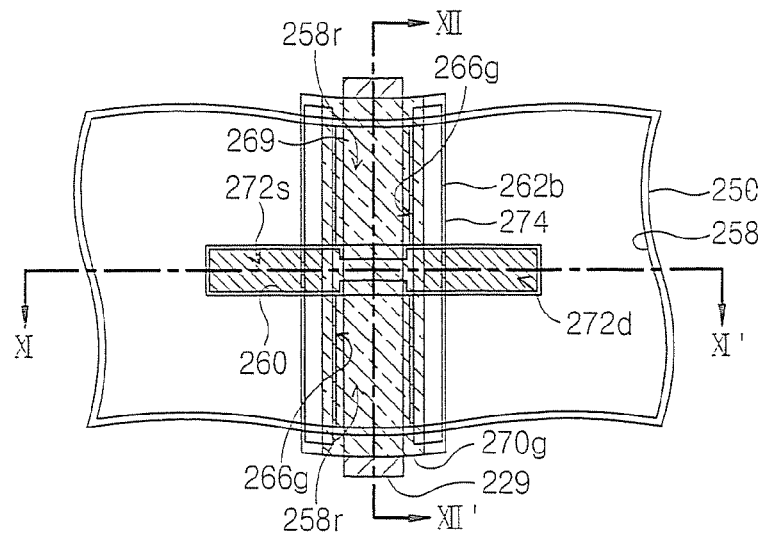
FIG. 41A is a plan view illustrating FinFETs according to yet still other embodiments of the present invention.
Figure 41B:
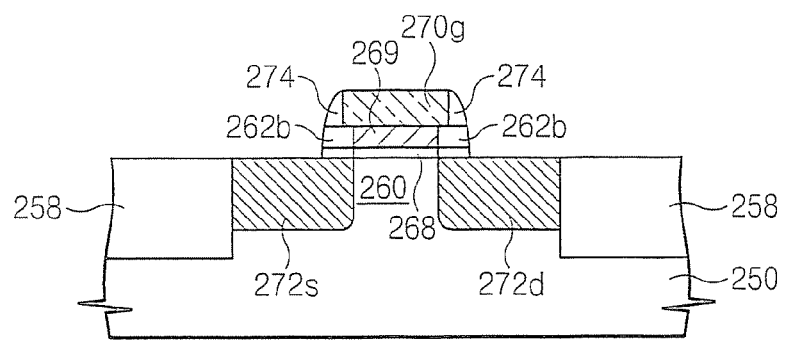
FIG. 41B is a cross-sectional view taken along line XI-XI' of FIG. 41A.
Figure 41C:
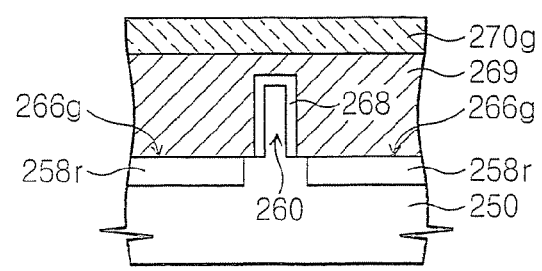
FIG. 41C is a cross-sectional view taken along line XII-XII' of FIG. 41A.

FIG. 41A is a plan view illustrating FinFETs according to yet still other embodiments of the present invention. FIG. 41B is a cross-sectional view taken along line XI-XI' of FIG. 41A. FIG. 41C is a cross-sectional view taken along line XII-XII' of FIG. 41A.

Referring now to FIGS. 41A, 41B and 41C, a fin-shaped active region 260 is formed vertically protruding from a semiconductor substrate 250. A device isolation layer 258 including a gate groove 266g covers sidewalls of the fin 260. A gate electrode fills the gate groove 266g and covers an upper portion and sidewalls of the fin 260. The bottom of the gate groove 266g may be formed by a recessed device isolation layer 258r. The gate electrode is fills the gate groove 266g and includes a lower gate pattern 269 and an upper gate pattern 270g. The lower gate pattern 269 covers the sidewalls and the upper portion of the fin 260. The upper gate pattern 270g is formed on the lower gate pattern 269. A gate insulation layer 268 is formed between the gate electrode and the upper portion and both sidewalls of the fin 260 to define a triple-gate structure. Accordingly, a channel region may be formed at both sidewalls the upper portion of the fin 260. Sidewall spacers are formed at both sidewalls of the gate electrode. Source/drain regions 272s and 272d are respectively formed in the fin 260 at opposite sides of the gate electrode. The sidewall spacers include lower sidewall spacers 262b formed at sidewalls of the lower gate pattern 269, and upper sidewall spacers 274 formed adjacent sidewalls of the upper gate pattern 270g.

The fin 260 may include a first portion covered by and/or under the lower gate pattern 269g, and a second portion where the source/drain regions 272s and 272d are formed. The portion covered by the lower gate pattern 269 may be self-aligned with the lower gate pattern 269, and may have a narrower width than the portion where the source/drain regions 272s and 272d are formed. A channel region is formed in the portion of the tin 260 covered by the lower gate pattern 269. Accordingly, the channel region is self-aligned with the lower gate pattern 269. The channel region is formed at the upper portion and both sidewalls of the fin 260.

As shown in FIGS. 41A, 41B and 41C, the portion of the fin 260 including the source/drain regions 272s and 272d may be wider than the portion of the fin 260 covered by the gate electrode in a direction parallel to the gate electrode. In other words, even though the portion of the fin 260 including the channel region may be recessed, the portion of the fin 260 where the source/drain regions 272s and 272d are formed may have a greater width/thickness, thereby reducing resistance at the source/drain regions 272s and 272d due to the greater contact surface area. In addition, resistance may be further reduced by forming a silicide layer on the source/drain regions 272s and 272d and the gate electrode.

FIGS. 42A to 45A are plan views illustrating exemplary operations for fabricating FinFETs according to yet still other embodiments of the present invention. FIGS. 42B to 45B are cross-sectional views taken along line XI-XI' of FIGS. 42A to 45A. FIGS. 42C to 45C are cross-sectional views taken along line XII-XII' of FIGS. 42A to 45A.

Figure 42A:
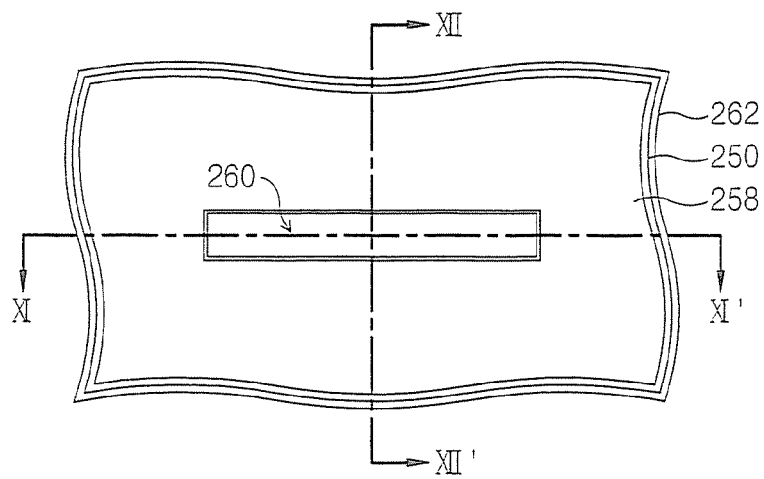
Figure 42B:
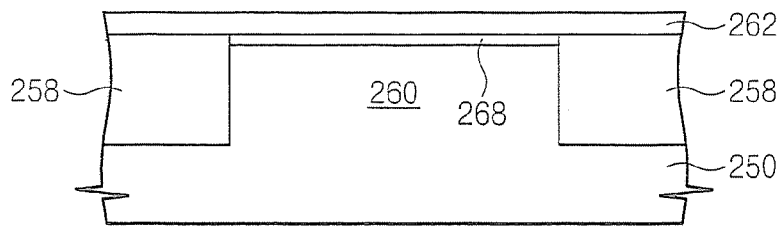
Figure 42C:
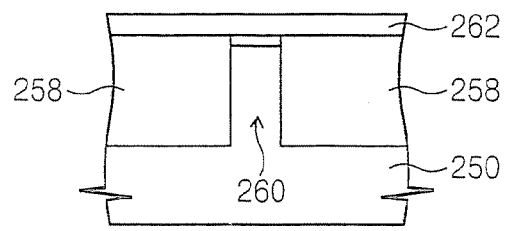

Referring to FIGS. 42A, 42B and 42C, a hard mask layer is formed on a semiconductor substrate 250. The hard mask layer and the semiconductor substrate 250 are patterned to define a vertically protruding fin-shaped active region 260 and a device isolation region. An insulation layer is formed on an entire surface of the semiconductor substrate 250, filling the device isolation region. The insulation layer is polished by CMP to form a device isolation layer 258 in the device isolation region. An insulation layer 262 used as a gate mask is formed on an entire surface of a substrate 250 including the device isolation layer 258. The insulation layer 262 can prevent the semiconductor substrate 250 and the device isolation layer 258 from being etched, and may be formed of silicon nitride. Before forming the insulation layer 262, a buffer oxide layer 268 may be further formed on the surface of the fin 260.

Figure 43A:
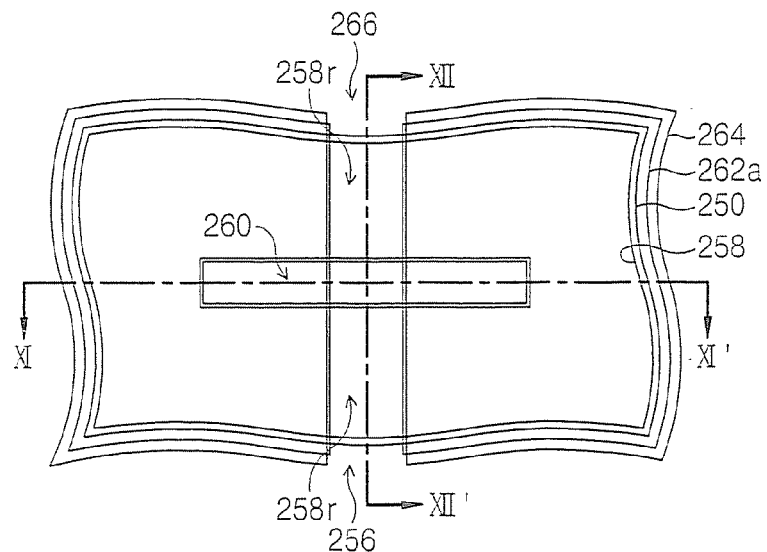
Figure 43B:
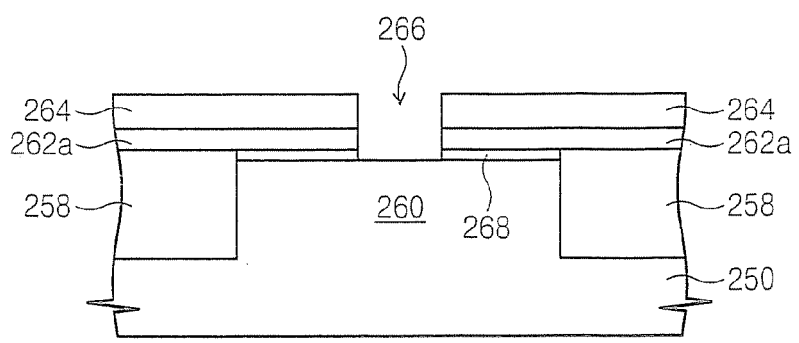
Figure 43C:
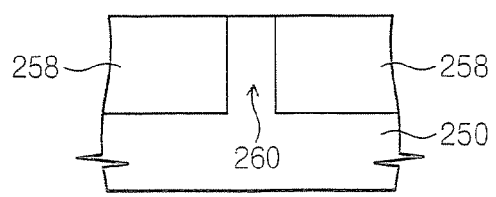

Referring to FIGS. 43A, 43B and 43C, a photoresist pattern 264 including a gate opening 266 is formed on the insulation layer 262. The gate opening 266 crosses over the fin 260. The insulation layer 262 is etched using the photoresist pattern 264 as an etching mask to form an insulation pattern 262a having an opening crossing over the fin 260.

Figure 44A:
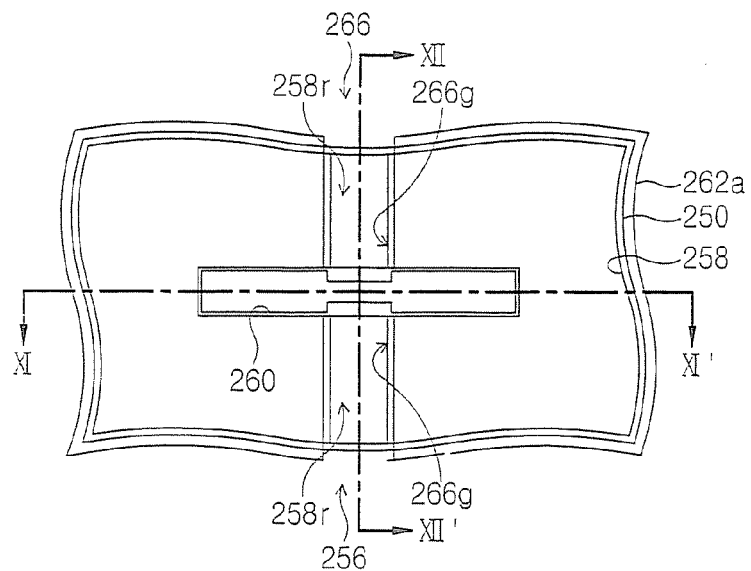
Figure 44B:
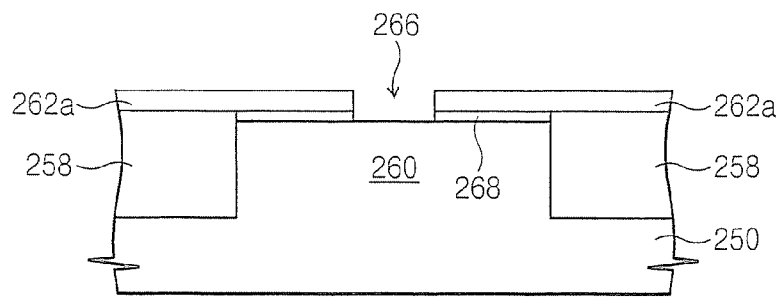
Figure 44C:
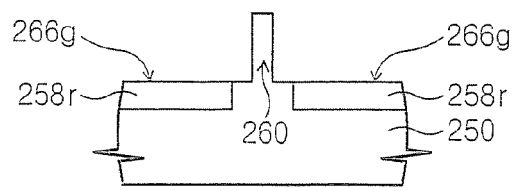

Referring to FIGS. 44A, 44B and 44C, a the device isolation layer 258 is etched using the photoresist pattern 264 as an etching mask to form a gate groove 226g. After forming the gate groove 266g, the photoresist pattern 264 is removed to expose an insulation pattern 262a. Alternatively, the photoresist pattern 264 may be removed after patterning only the insulation layer 262a, and the insulation pattern 262a may then be used as an etching mask to etch the device isolation layer 258 and form the gate groove 266g. The gate groove 266g is formed such that a recessed device isolation layer 258r remains at the bottom of the gate groove 266g. The width/thickness of the fin 260 is then reduced by recessing the sidewalls of the fin 260 exposed to the gate grove 266g. The fin 260 may be recessed using an isotropic etching process, or by removing an oxide layer formed by a thermal oxidation process. A channel region may be formed by implanting impurities into the exposed sidewalls of the fin 260. The channel region may also be formed by implanting impurities after forming the fin 260.

Figure 45A:
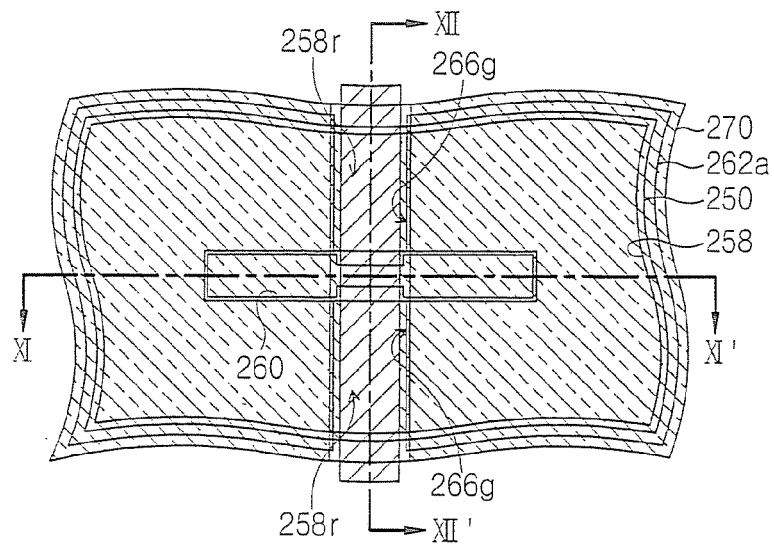
Figure 45B:
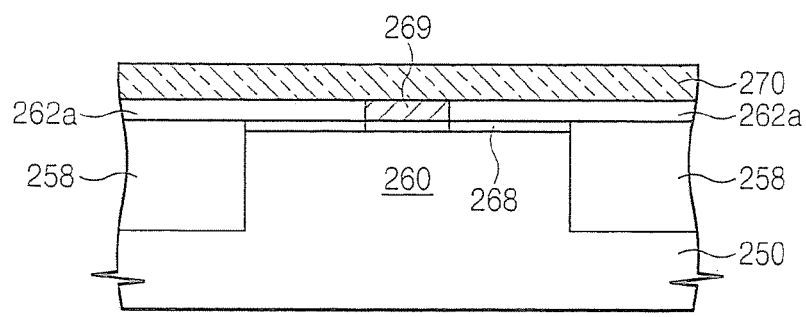
Figure 45C:
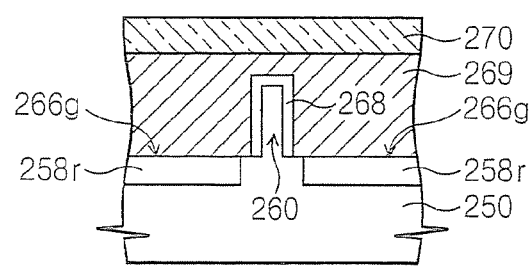

Referring to FIGS. 45A, 45B and 45C, a gate insulation layer 268 is formed on the upper surface and sidewalls of fin 260 exposed by the gate groove 266g. A first conductive layer is formed on an entire surface of a substrate, filling the gate groove 266g where the gate insulation layer 268 is formed. The first conductive layer is recessed by etch-back or CMP to form a lower gate pattern 269 covering the upper portion and both sidewalls of the fin 260. A second conductive layer 270 is formed on an entire surface of a substrate where the lower gate pattern 269 is formed. The second conductive layer 270 may have excellent conductivity and may be formed of metal or metal silicide. The second conductive layer 270 may also be formed of polysilicon, and may be silicided in a subsequent process.

Although not shown, sidewall spacers and source/drain regions 272s and 272d are formed to form the transistor shown in FIGS. 41A, 41B and 41C.

More specifically, the second conductive layer 270 is patterned to form an upper gate pattern 270g on the lower gate pattern 269. The upper gate pattern 270g crosses over the fin 260. Impurities are implanted into the fin 260 using the upper gate pattern 270g as an ion implantation mask to form source/drain regions 272s and 272d in the fin 260 at opposite sides of the upper gate pattern 270g. The impurities may be transmitted through the insulation pattern 262a to be implanted into the fin 260, and may be diffused into a portion of the fin 260 adjacent to the lower gate pattern 229. Upper sidewall spacers 274 are formed at both sidewalls of the upper gate electrode 270g. Although not shown, a silicide layer may be further formed at the exposed upper surface of the fin 260, that is, on the source/drain regions 272s and 272d. In addition, the silicide layer may also be formed on the upper surface of the gate electrode.

The source/drain regions 272s and 272d may be formed before or after forming the sidewall spacers 274. More particularly, before forming the sidewall spacers 274, the upper surface of the fin 260 is exposed, such that oblique ion implantation may not be suitable. In this case, if projection range Rp is used, ions may be diffused under the gate in a thermal annealing process to form a uniform ion profile. Accordingly, it may be possible to prevent ions from being diffused under the gate by controlling implantation depth, implanting ions by swiping implantation energy, and by applying rapid thermal annealing.

After forming the sidewall spacers 274, the area between the ion implantation region and the gate is covered by the spacers 274. Therefore, ions may be thermally diffused after implanting ions in projection range Rp. In other words, the spacers 274 may prevent ions from being diffused under the gate. However, the same ion implantation method used before forming the sidewall spacer 274 may also be used.

Figure 46A:
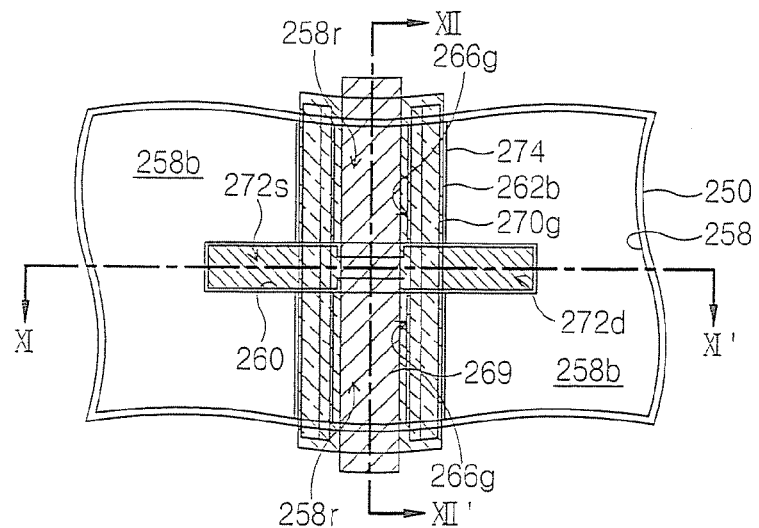
FIG. 46A is a plan view illustrating FinFETs according to further embodiments of the present invention.
Figure 46B:
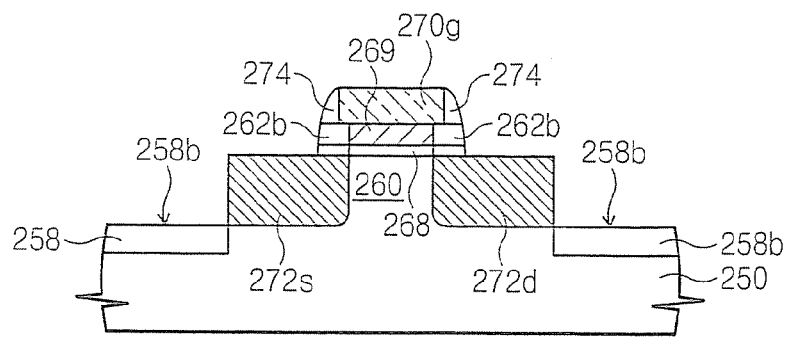
FIG. 46B is a cross-sectional view taken along line XI-XI' of FIG. 46A.
Figure 46C:
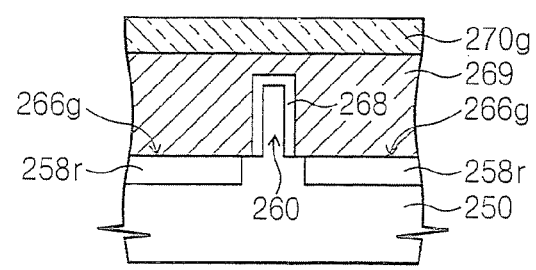
FIG. 46C is a cross-sectional view taken along line XII-XII' of FIG. 46A.

FIG. 46A is a plan view illustrating FinFETs according to further embodiments of the present invention. FIG. 46B is a cross-sectional view taken along line XI-XI' of FIG. 46A. FIG. 46C is a cross-sectional view taken along line XII-XII' of FIG. 46A.

Referring to FIGS. 46A, 46B and 46C, the device isolation layer 258 of a transistor according to the embodiments of FIGS. 41A, 41B and 41C is aligned with sidewall spacers 274 and recessed to form a recessed portion 258b. Accordingly, the exposed surface area of the source/drain regions 272s and 272d may be increased, thereby decreasing contact resistance. In addition, the surface area of the source/drain regions 272s and 272d to be exposed may be controlled based on a recessed depth of the device isolation layer 258. In this case, the source/drain regions 272s and 272d may be formed after recessing the device isolation layer 258. The source/drain regions 272s and 272d may be formed using an oblique ion implantation method.

Figure 47A:
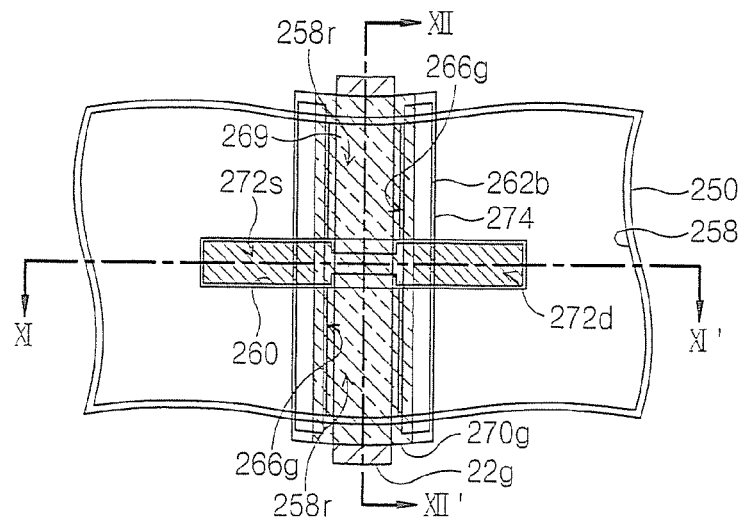
FIG. 47A is a plan view illustrating FinFETs according to still further embodiments of the present invention.
Figure 47B:
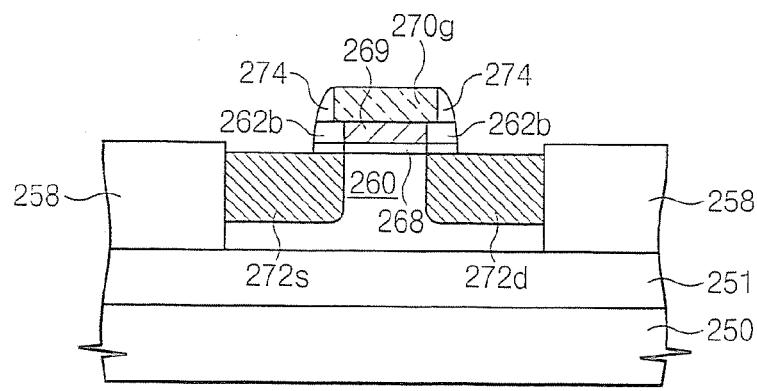
FIG. 47B is a cross-sectional view taken along line XI-XI' of FIG. 47A.
Figure 47C:
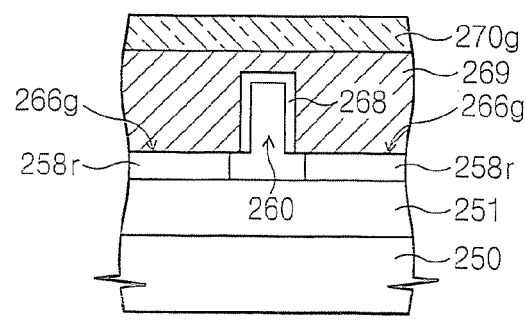
FIG. 47C is a cross-sectional view taken along line XII-XII' of FIG. 47A.

FIG. 47A is a plan view illustrating FinFETs formed on a SOI substrate according to still further embodiments of the present invention. FIG. 47B is a cross-sectional view taken along line XI-XI' of FIG. 47A. FIG. 47C is a cross-sectional view taken along line XII-XII' of FIG. 47A.

Referring now to FIGS. 47A, 47B and 47C, a SOI substrate includes a base substrate 250, a buried insulation layer 251 formed on the base substrate 250 and a semiconductor layer on the buried insulation layer 251. The semiconductor layer may be formed of silicon, silicon-germanium and/or graded silicon, where the lattice distance of silicon is increased. The semiconductor layer is patterned to form a vertically protruding fin-shaped active region 260 on the buried insulation layer 251. A device isolation layer 258 including a gate groove 266g covers sidewalls of the fin 260. The bottom of the gate groove 266g may be formed by a recessed device isolation layer 258r or the buried insulation layer 251. A gate electrode fills the gate grove 266g and covers the upper portion and both sidewalls of the fin 260. The gate electrode includes a lower gate pattern 269 and an upper gate pattern 270g. The lower gate pattern 269 covers the upper portion and both sidewalls of the fin 260. The upper gate pattern 270g is formed on the lower gate pattern 269. A gate insulation layer 268 is positioned between the lower gate electrode 269 and the upper portion and both sidewalls of the fin 260 to define a triple-gate structure. Sidewall spacers are formed at both sidewalls of the gate electrode. Source/drain regions 272s and 272d are respectively formed in the fin 260 at opposite sides of the gate electrode. The sidewall spacers include lower sidewall spacers 262b formed at sidewalls of the lower gate pattern 269 and upper sidewall spacers 274 formed at sidewalls of the upper gate pattern 270g.

The fin 260 may include a first portion covered by and/or under the lower gate pattern 269g, and a second portion where the source/drain regions 272s and 272d are formed. The portion covered by the lower gate pattern 269 is self-aligned with the lower gate pattern 269 and may have a narrower width than the portion where the source/drain regions 272s and 272d are formed. A channel region is formed on the portion of the fin 260 covered by the lower gate pattern 269. Accordingly, the channel region is self-aligned with the lower gate pattern 269. The channel region is formed at upper portion and at both sidewalls of the fin 260. The device isolation layer 258 is aligned with the sidewall spacers and is recessed to form a recessed device isolation layer 258r. Therefore, the source/drain regions 272s and 272d may be exposed at sidewalls of the fin 260, providing a greater contact surface area and thus reduced contact resistance. In addition, a silicide layer may be formed on source/drain regions 272s and 272d and on the gate electrode to further reduce resistance.

In the embodiments described above, if the source/drain regions are formed under the gate electrode, punch-through may become a problem. Accordingly, a bottom depth of the source/drain regions may preferably be equal to or above the bottom of the gate electrode. Therefore, when the device isolation layer is recessed to expose sidewalls of the fin (and thereby expose the source/drain regions), it may be preferable that the device isolation layer is recessed to a depth equal to or above the depth of the recessed device isolation layer under the gate electrode.

As discussed above, the source/drain regions are exposed at sidewalls of the fin so that it may be possible to increase the available contact area for source/drain contacts to be connected to the source/drain regions. Accordingly, contact resistance at the source/drain regions can be reduced without increasing the size of the source/drain regions. In addition, the width/thickness of the fin may be reduced by recessing only the portion of the fin exposed by the gate groove in the damascene process used to form the gate. As a result, the width of the fin where the source/drain regions are formed is not reduced, so it is not necessary to increase the thickness of the fin where the source/drain regions are formed to increase contact area.

Thus, according to embodiments of the present invention. FinFETs may be formed with reduced contact resistance at the source/drain regions without increasing the occupied area of the transistors.

While the present invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. A FinFET device, comprising:
a semiconductor bulk substrate having a device isolation layer thereon;
a fin-shaped active region vertically protruding from the semiconductor bulk substrate between portions of the device isolation layer, the fin-shaped active region having first and second source/drain regions therein and a channel region therebetween;
a gate electrode on an upper surface and sidewalls of the channel region; and
first and second source/drain contacts on respective upper surfaces of the first and second source/drain regions of the fin-shaped active region at opposite sides of the gate electrode,
wherein the device isolation layer is recessed to expose sidewalls of the first and second source/drain regions above an upper surface of the semiconductor bulk substrate such that the first and second source/drain contacts are also in contact with the sidewalls of the first and second source/drain regions of the fin-shaped active region at opposite sides of the gate electrode.

2. The device of claim 1, wherein the channel region is narrower than the first and second source/drain regions of the fin-shaped active region.

3. The device of claim 1, further comprising:
a gate insulation layer on the upper surface and sidewalls of the channel region between the gate electrode and the channel region to form a triple-gate FinFET device.

4. The device of claim 3, further comprising:
a capping insulation layer on the upper surface of the channel region between the gate electrode and the channel region to form a double-gate FinFET device.

5. The device of claim 4, wherein the channel region is narrower than the capping insulation layer.

6. The device of claim 1, further comprising:
sidewall spacers on the first and second source/drain regions adjacent opposing sidewalls of the gate electrode.

7. The device of claim 6, wherein the gate electrode comprises a lower gate electrode on the upper surface and sidewalls of the channel region and an upper gate electrode on the lower gate electrode.

8. The device of claim 7, wherein the sidewall spacers respectively comprise an upper sidewall spacer adjacent sidewalls of the upper gate electrode and a lower sidewall spacer adjacent sidewalls of the lower gate electrode.

9. A FinFET device, comprising:
a semiconductor bulk substrate;
a fin-shaped active region vertically extending from the semiconductor bulk substrate;
a device isolation layer adjacent sidewalls of the tin-shaped active region, the device isolation layer being recessed to be lower than the fin-shaped active region;
a gate electrode on an upper surface and sidewalls of the fin-shaped active region;
sidewall spacers on sidewalls of the gate electrode; and
source/drain regions in the fin-shaped active region at opposite sides of the gate electrode, wherein the source/drain regions are formed above the recessed device isolation layer such that upper surfaces and sidewalls of the fin-shaped active region are exposed at the source/drain regions.

10. The device of claim 9, further comprising:
source/drain contacts on the respective exposed upper surface and sidewalls of the source/drain regions of the fin-shaped active region at opposite sides of the gate electrode.

11. The device of claim 9, further comprising:
a channel region in the tin-shaped active region between the source/drain regions; and
a gate insulation layer between the gate electrode and the channel region.

12. The device of claim 11, wherein the channel region is narrower than the source/drain regions of the fin-shaped active region.

13. The device of claim 11, wherein the channel region includes sidewall portions of the fin-shaped active region to form a double-gate FinFET device.

14. The device of claim, 13 further comprising:
a capping insulation layer on an upper surface of the channel region between the gate electrode and the channel region.

15. The device of claim 11, wherein the channel region includes both sidewall and upper portions of the fin-shaped active region to form a triple-gate FinFET device.

16. The device of claim 11, wherein the gate electrode comprises:
a lower gate electrode on the upper surface and sidewalls of the fin-shaped active region; and
an upper gate electrode on the lower gate electrode.

17. The device of claim 16, wherein the channel region includes both sidewall and upper portions of the fin-shaped active region covered by the lower gate electrode to form a triple-gate FinFET device.

18. The device of claim 17, wherein the gate insulation layer is between the lower gate electrode and the channel region.

19. The device of claim of claim 16, wherein the sidewall spacers comprise:
upper sidewall spacers adjacent sidewalls of the upper gage electrode; and
lower sidewall spacers adjacent sidewalls of the lower gate electrode.

20. A FinFET device, comprising:
a semiconductor bulk substrate having a device isolation layer therein;
a fin-shaped active region vertically protruding from the semiconductor bulk substrate between portions of the device isolation layer, the fin-shaped active region having first and second source/drain regions therein and a channel region therebetween;
a gate electrode on an upper surface and sidewalls of the channel region; and
first and second source/drain contacts on respective upper surfaces of the first and second source/drain regions of the fin-shaped active region at opposite sides of the gate electrode,
wherein the device isolation layer is elevated to at least the upper surfaces of the first and second source/drain regions to cover sidewalls of the first and second source/drain regions at opposite sides of the gate electrode and is recessed at under the gate electrode.

* * * * *

UNITED STATES PATENT AND TRADEMARK OFFICE
CERTIFICATE OF CORRECTION

| | | |
|---|---|---|
| PATENT NO. | : 8,466,511 B2 | Page 1 of 1 |
| APPLICATION NO. | : 12/613025 | |
| DATED | : June 18, 2013 | |
| INVENTOR(S) | : Oh et al. | |

It is certified that error appears in the above-identified patent and that said Letters Patent is hereby corrected as shown below:

In the Claims:

Column 29, Claim 9, Line 19: Please correct "tin-shaped" to read -- fin-shaped --

Column 29, Claim 11, Line 37: Please correct "tin-shaped" to read -- fin-shaped --

Signed and Sealed this
First Day of March, 2016

Michelle K. Lee
*Director of the United States Patent and Trademark Office*